US008361697B2

(12) United States Patent
Hata

(10) Patent No.: US 8,361,697 B2
(45) Date of Patent: *Jan. 29, 2013

(54) PHOTOSENSITIVE RESIN COMPOSITION, PHOTOSENSITIVE RESIN LAMINATE, METHOD FOR FORMING RESIST PATTERN AND PROCESS FOR PRODUCING PRINTED CIRCUIT BOARD, LEAD FRAME, SEMICONDUCTOR PACKAGE AND CONCAVOCONVEX BOARD

(75) Inventor: Yosuke Hata, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 243 days.

This patent is subject to a terminal disclaimer.

(21) Appl. No.: 12/864,150

(22) PCT Filed: Mar. 19, 2009

(86) PCT No.: PCT/JP2009/055466
§ 371 (c)(1),
(2), (4) Date: Jul. 22, 2010

(87) PCT Pub. No.: WO2009/116632
PCT Pub. Date: Sep. 24, 2009

(65) Prior Publication Data
US 2010/0297559 A1 Nov. 25, 2010

(30) Foreign Application Priority Data

Mar. 21, 2008 (JP) .................. 2008-073115
Mar. 21, 2008 (JP) .................. 2008-073125
Mar. 21, 2008 (JP) .................. 2008-073135

(51) Int. Cl.
*G03F 7/031* (2006.01)
*G03F 7/033* (2006.01)
*G03F 7/40* (2006.01)

(52) U.S. Cl. ............. 430/285.1; 430/313; 430/315; 430/291; 430/325; 430/271.1; 430/910; 430/920; 430/916; 430/281.1; 522/16

(58) Field of Classification Search .................. None
See application file for complete search history.

(56) References Cited

U.S. PATENT DOCUMENTS

| 5,221,595 A | 6/1993 | Lingnau et al. |
| 2009/0029289 A1 | 1/2009 | Miyasaka et al. |
| 2009/0176176 A1 | 7/2009 | Araki et al. |
| 2009/0233230 A1 | 9/2009 | Hata et al. |
| 2010/0119977 A1 | 5/2010 | Hata |

FOREIGN PATENT DOCUMENTS

| EP | 0 530 095 A1 | 3/1993 |
| JP | 4-223470 A | 8/1992 |
| JP | 5-255420 A | 10/1993 |
| JP | 2004-219660 A * | 8/2004 |
| JP | 2005-325030 A | 11/2005 |
| JP | 2007-102184 A | 4/2007 |
| JP | 2007-248590 A | 9/2007 |
| KR | 10-2007-050125 A * | 5/2007 |
| WO | WO 2006/126480 A1 | 11/2006 |
| WO | WO 2007/010614 A1 | 1/2007 |
| WO | WO 2007/116941 A1 | 10/2007 |
| WO | WO 2008/126526 A1 | 10/2008 |

OTHER PUBLICATIONS

English translation of KR-10-2007-050125-A published May 15, 2007, machine generated from KIPO website, 6 pages, http://kposd.kipo.go.kr:8088/up/kpion/.*
Kim et al Derwent -Acc-No. 2008-H26457 , English abstract of KR-10-2007-050125-A , Derwnt Information LTD, three pages with structure attached obtained from Derwent file of East database at USPTO on May 31, 2012.*
English translation of JP, 2004-219660a (2004) from machine translation from AIPN Japan Patent Office National Center for Industrial Property Information and Training, generated May 25, 2012, 24 pages.*
Tween 85, chemBLink, http://www.chemblink.com/products/9005-70-3.htm downloaded n May 31, 2012.*
Office Action issued Jan. 18, 2012, in Chinese Patent Application No. 200980110206.7.
Taiwanese Office Action, dated Aug. 23, 2012, issued in Taiwanese Patent Application No. 098109239.

* cited by examiner

*Primary Examiner* — Cynthia Hamilton
(74) *Attorney, Agent, or Firm* — Birch, Stewart, Kolasch & Birch, LLP

(57) ABSTRACT

[Purpose]
To provide a photosensitive resin composition having satisfactory compatibility during dry film formation, exhibiting similar sensitivity for exposure with both i-line radiation and h-line radiation type exposure devices, having excellent resolution and adhesiveness, allowing development with aqueous alkali solutions, and preferably, having no generation of aggregates during development.
[Solution Means]
A photosensitive resin composition comprising (a) 20-90 wt % of a thermoplastic copolymer having a specific copolymerizing component copolymerized, and having a carboxyl group content of 100-600 acid equivalents and a weight-average molecular weight of 5,000-500,000, (b) 5-75 wt % of an addition polymerizable monomer having at least one terminal ethylenic unsaturated group, (c) 0.01-30 wt % of a photopolymerization initiator containing a triarylimidazolyl dimer, and (d) 0.001-10 wt % of a pyrazoline compound.

14 Claims, No Drawings

PHOTOSENSITIVE RESIN COMPOSITION, PHOTOSENSITIVE RESIN LAMINATE, METHOD FOR FORMING RESIST PATTERN AND PROCESS FOR PRODUCING PRINTED CIRCUIT BOARD, LEAD FRAME, SEMICONDUCTOR PACKAGE AND CONCAVOCONVEX BOARD

TECHNICAL FIELD

The present invention relates to a photosensitive resin composition that can be developed with aqueous alkali solutions, to a photosensitive resin laminate obtained by laminating the photosensitive resin composition on a support, to a method for forming a resist pattern on a board using the photosensitive resin laminate, and to use of the resist pattern. More specifically, the invention relates to a photosensitive resin composition that can form a resist pattern suitable as a protective mask member for metal foil precision working in production of printed circuit boards, production of flexible printed circuit boards, production of IC chip-mounting lead frames (hereunder referred to as "lead frames") and production of metal masks, for production of semiconductor packages such as BGA (ball grid arrays) and CSP (chip-size packages), for production of tape boards including TAB (Tape Automated Bonding) or COF (Chip On Film: semiconductor IC mounted on a film-like microwiring board), for production of semiconductor bumps, for production of members such as ITO electrodes, address electrodes or electromagnetic wave shields in the field of flat panel displays, and for production of concavoconvex boards obtained by working of substrates by sand blast working.

BACKGROUND ART

Printed circuit boards have conventionally been produced by photolithography methods. Photolithography is a method in which a photosensitive resin composition is coated onto a substrate and subjected to pattern exposure for polymerization and curing of the exposed sections of the photosensitive resin composition, and the unexposed sections are removed with a developing solution to form a resist pattern on the board, and after forming a conductor pattern by etching or plating treatment, the resist pattern is released and removed from the board to form a conductor pattern on the board.

In such photolithography methods, the layer composed of the photosensitive resin composition (hereunder referred to as "photosensitive resin layer") is laminated on the board by a method of coating the board with a photoresist solution and drying it, or a method of laminating the board with a photosensitive resin laminate (hereunder also referred to as "dry film resist") obtained by successively laminating a support, a photosensitive resin layer and if necessary a protective layer. A dry film resist is most commonly used for production of printed circuit boards.

A method for producing a printed circuit board using a dry film resist will now be explained in brief. First, when a protective layer such as a polyethylene film is present, it is released from the photosensitive resin layer. Next, a laminator is used to laminate the photosensitive resin layer and support on a copper clad laminate or other board, so that the order: substrate, photosensitive resin layer, support is obtained. The photosensitive resin layer is then exposed with ultraviolet rays such as i-line radiation (365 nm) from an ultrahigh pressure mercury lamp through a photomask with a wiring pattern, for polymerization curing of the exposed sections. The support composed of polyethylene terephthalate or the like is then released. Next, the unexposed sections of the photosensitive resin layer are removed by dissolution or dispersion with a developing solution such as a weakly alkaline aqueous solution, to form a resist pattern on the board. The formed resist pattern is then used as a protective mask for a publicly known process such as etching or pattern plating. Finally, the resist pattern is released from the board to produce a board with a conductor pattern, i.e., a printed circuit board.

When a dry film resist is used, the unpolymerized composition disperses in the developing solution during the developing step in which the unexposed sections are dissolved with the weak alkaline aqueous solution. It is known that when this dispersed substance collects it becomes aggregates in the developing solution, and re-adheres to the board causing shorting defects. When the developing solution is circulated through a filter to prevent such aggregates, a large number of aggregates lead to management problems such as increased filter replacement frequency and a shorter interval for washing of the developing machine. It has been attempted to increase the hydrophilicity of the aggregates by adding a hydrophilic group such as an ethylene oxide chain to the monomer or polymer, or to use a nonylphenol-type monomer to reduce aggregates (Patent document 1), but the problems have not been completely solved by these measures. A novel photosensitive resin composition that can prevent generation of aggregates in developing solutions has therefore been long desired.

Moreover, increased resolution is being demanded for photosensitive resin compositions because of increased micronization of printed circuit boards in recent years, and from the viewpoint of productivity there is a demand for increased sensitivity of photosensitive resin compositions to allow shorter exposure times.

With the micronization of interconnect pitches of printed circuit boards in recent years, higher resolutions for dry film resists are in demand. Higher sensitivity is also desired from the viewpoint of improving productivity. On the other hand, various types of exposure systems are used depending on the purpose, and maskless exposure that does not require a photomask, such as direct imaging with a laser, is increasing in popularity. Maskless exposure is largely divided according to whether the light source is i-line radiation (365 nm) or h-line radiation (405 nm), and the advantages of each are used to fulfill different purposes. For dry film resists, it is necessary to allow use under the same conditions for "both" types of exposure device; i.e., importance is placed on exhibiting approximately the same sensitivity for "both" types of exposure device and to allow formation of resist patterns with high sensitivity, high resolution and high adhesiveness.

Benzophenone, Michler's ketone and their derivatives, that have been widely used as photopolymerization initiators in photosensitive resin compositions for dry film resists, have absorption ranges localized near a wavelength of 360 nm. Therefore, dry film resists employing such photopolymerization initiators have reduced sensitivity the closer the exposure light source wavelength is to the visible light range, and this makes it difficult to obtain sufficient resolution and adhesiveness with light sources of 400 nm and longer wavelengths.

Thioxanthone and its derivatives, as alternative photopolymerization initiators, can form combinations that exhibit high sensitivity for exposure light sources with wavelengths near 380 nm, by appropriate selection of the sensitizing agent. However, it is usually not possible to obtain sufficient resolution even with resist patterns formed using such combinations, and the sensitivity is still reduced for exposure light sources with wavelengths of 400 nm and longer.

Patent document 2 discloses hexaarylbisimidazole and 1,3-diaryl-pyrazoline or 1-aryl-3-aralkenyl-pyrazoline, as photoreaction initiators with high photosensitivity and satisfactory image reproducibility, and describes examples of forming dry film resists. However, when the present inventors prepared dry film photoresists with photosensitive resin layers comprising 1,5-diphenyl-3-styryl-pyrazoline and 1-phenyl-3-(4- methyl-styryl)-5-(4-methyl-phenyl)-pyrazoline, as compounds specifically mentioned in Patent document 2, the compounds remained undissolved in the photosensitive resin layer and could not be used as dry film resists.

Patent document 3 and Patent document 4 disclose examples of using 1-phenyl-3-(4-tert-butyl-styryl)-5-(p-tert-butyl-phenyl)-pyrazoline. However, although these photoreaction initiators exhibit high sensitivity with exposure using an h-line radiation type exposure apparatus with a wavelength of 405 nm, exposure with i-line radiation type exposure apparatuses has not been able to provide sensitivity comparable to exposure with h-line radiation type exposure apparatuses.

For this reason, it has been desired to provide a photosensitive resin composition that exhibits satisfactory compatibility as a photosensitive resin composition for a dry film resist, that has similar sensitivity for both i-line radiation and h-line radiation type exposure devices, and that exhibits satisfactory sensitivity, resolution and adhesiveness, while a photosensitive resin composition that does not generate aggregates during development has also been desired.

[Patent document 1] Japanese Unexamined Patent Publication HEI No. 07-092673
[Patent document 2] Japanese Unexamined Patent Publication HEI No. 04-223470
[Patent document 3] Japanese Unexamined Patent Publication No. 2005-215142
[Patent document 4] Japanese Unexamined Patent Publication No. 2007-004138

DISCLOSURE OF THE INVENTION

Problems to be Solved by the Invention

It is an object of the present invention to provide a photosensitive resin composition that has satisfactory compatibility during dry film formation (i.e. without deposition of insoluble substances), exhibits similar sensitivity for exposure with both i-line radiation and h-line radiation type exposure devices, has excellent resolution and adhesiveness, allows development with aqueous alkali solutions and preferably can also prevent generation of aggregates during development, as well as a photosensitive resin laminate employing the photosensitive resin composition, a method for forming a resist pattern onto boards using the photosensitive resin laminate, and use of the resist pattern.

Means for Solving the Problems

As a result of much diligent research directed toward achieving this object, the present inventors have completed this invention upon discovering that the object is achieved by the following construction of the invention. Specifically, the present invention is as follows.

(1) A photosensitive resin composition comprising the following components (a) to (d):
(a) 20-90 wt % of a thermoplastic copolymer obtained by copolymerization of a copolymerizing component containing at least one compound selected from the group consisting of compounds represented by the following formula (I):

[Chemical Formula 1]

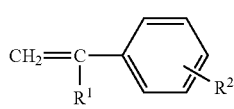

(I)

(wherein $R^1$ represents hydrogen atom or methyl group, and $R^2$ represents a group selected from the group consisting of hydrogen atom, halogen atoms, hydroxyl, C1-12 alkyl, C1-12 alkoxy, carboxyl and haloalkyl groups), and compounds represented by the following formula (II):

[Chemical Formula 2]

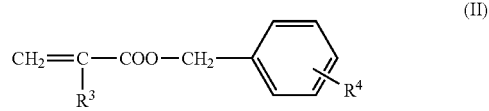

(II)

(wherein $R^3$ represents hydrogen atom or methyl group, and $R^4$ represents a group selected from the group consisting of hydrogen atom, halogen atoms, hydroxyl, C1-12 alkyl, C1-12 alkoxy, carboxyl and haloalkyl groups), and having a carboxyl group content of 100-600 acid equivalents and a weight-average molecular weight of 5,000-500,000, (b) 5-75 wt % of an addition polymerizable monomer having at least one terminal ethylenic unsaturated group, (c) 0.01-30 wt % of a photopolymerization initiator containing a triarylimidazolyl dimer, and (d) 0.001-10 wt % of a pyrazoline compound represented by the following formula (III):

[Chemical Formula 3]

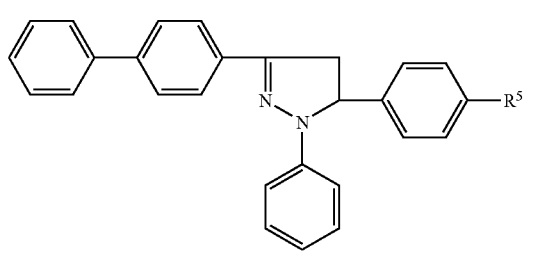

(III)

(wherein $R^5$ represents a C4-12 straight-chain or branched-chain alkyl group).

(2) A photosensitive resin composition according to (1) above, which contains 2-ethylhexyl acrylate and/or 2-hydroxyethyl methacrylate as a copolymerizing component of the (a) thermoplastic copolymer.

(3) A photosensitive resin composition according to (1) or (2) above, which further comprises a compound represented by the following formula (IV):

[Chemical Formula 4]

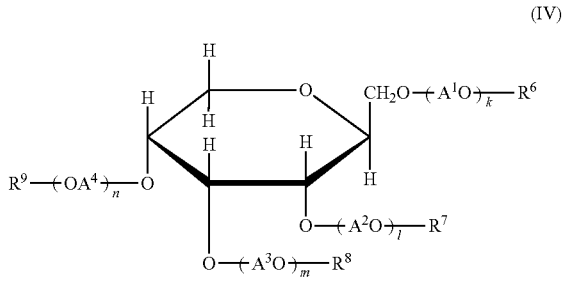

(IV)

(wherein $R^6$, $R^7$, $R^8$ and $R^9$ each independently represent hydrogen atom or a C1-30 fatty acid acyl group, $A^1$, $A^2$, $A^3$ and $A^4$ are each independently —CH(CH$_3$)CH$_2$—, —CH$_2$CH(CH$_3$)— or —CH$_2$CH$_2$—, wherein the repeating structures -(A$^1$-O)-, -(A$^2$-O)-, -(A$^3$-O)- and -(A$^4$-O)- may each be random or block, k, l, m and n are each independently an integer of 0 or greater and k+l+m+n=0-40).

(4) A photosensitive resin composition comprising:
(a) 20-90 wt % of a thermoplastic copolymer obtained by copolymerization of a copolymerizing component comprising an α,β-unsaturated carboxyl group-containing monomer, and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 5]

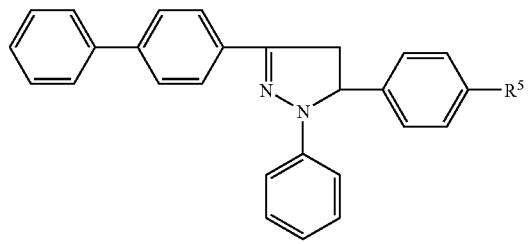

(III)

(wherein $R^5$ represents a C4-12 straight-chain or branched-chain alkyl group),
wherein the (b) addition polymerizable monomer having at least one terminal ethylenic unsaturated group contains at least one addition polymerizable monomer represented by the following formula (V):

[Chemical Formula 6]

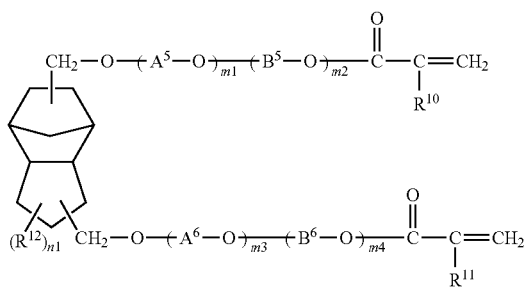

(V)

(wherein $R^{10}$ and $R^{11}$ each independently represent hydrogen atom or methyl group, $R^{12}$ represents a halogen atom or a C1-3 alkyl group, $A^5$, $A^6$, $B^5$ and $B^6$ each independently represent a C2-6 alkylene group, wherein the repeating structures $-(A^5\text{-O})-$, $-(A^6\text{-O})-$, $-(B^5\text{-O})-$ and $-(B^6\text{-O})-$ may each be random or block, m1, m2, m3 and m4 are each independently an integer of 0 or greater, m1+m2+m3+m4=0-40, and n1 is 0-14).

(5) A photosensitive resin composition according to (4) above, wherein the (b) addition polymerizable monomer having at least one terminal ethylenic unsaturated group contains at least one selected from the group consisting of compounds represented by the following formula (VI):

[Chemical Formula 7]

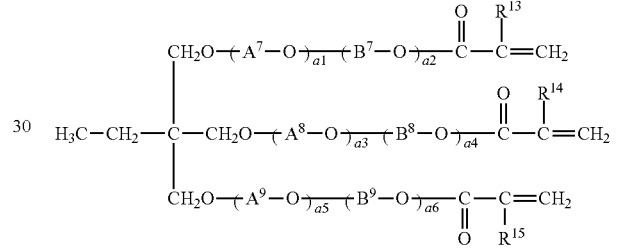

(VI)

(wherein $R^{13}$, $R^{14}$ and $R^{15}$ each independently represent hydrogen atom or methyl group, $A^7$, $A^8$, $A^9$, $B^7$, $B^8$ and $B^9$ each independently represent a C2-6 alkylene group, wherein the repeating structures $-(A^7\text{-O})-$, $-(A^8\text{-O})-$, $-(A^9\text{-O})-$, $-(B^7\text{-O})-$, $-(B^8\text{-O})-$ and $-(B^9\text{-O})-$ may each be random or block, a1, a2, a3, a4, a5 and a6 are each independently an integer of 0 or greater, and a1+a2+a3+a4+a5+a6=0-50), and compounds represented by the following formula (VII):

[Chemical Formula 8]

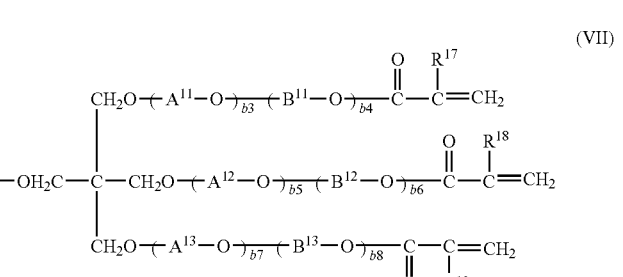

(VII)

(wherein $R^{16}$, $R^{17}$, $R^{18}$ and $R^{19}$ each independently represent hydrogen atom or methyl group, $A^{10}$, $A^{11}$, $A^{12}$, $A^{13}$, $B^{10}$, $B^{11}$, $B^{12}$ and $B^{13}$ each independently represent a C2-6 alkylene group, wherein the repeating structures -($A^{10}$-O)-, ($A^{11}$-O)-, ($A^{12}$-O)-, ($A^{13}$-O)-, ($B^{10}$-O)-, ($B^{11}$-O)-, ($B^{12}$-O)- and -($B^{13}$-O)- may each be random or block, b1, b2, b3, b4, b5, b6, b7 and b8 are each independently an integer of 0 or greater, and b1+b2+b3+b4+b5+b6+b7+b8=0-60).

(6) A photosensitive resin composition comprising:
(a) 20-90 wt % of a thermoplastic copolymer obtained by copolymerization of a copolymerizing component comprising an α,β-unsaturated carboxyl group-containing monomer, and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 9]

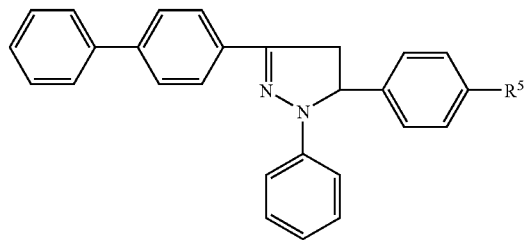

(III)

(wherein $R^5$ represents a C4-12 straight-chain or branched-chain alkyl group),
wherein the (b) addition polymerizable monomer having at least one terminal ethylenic unsaturated group contains at least one selected from the group consisting of compounds represented by the following formula (VIII):

[Chemical Formula 10]

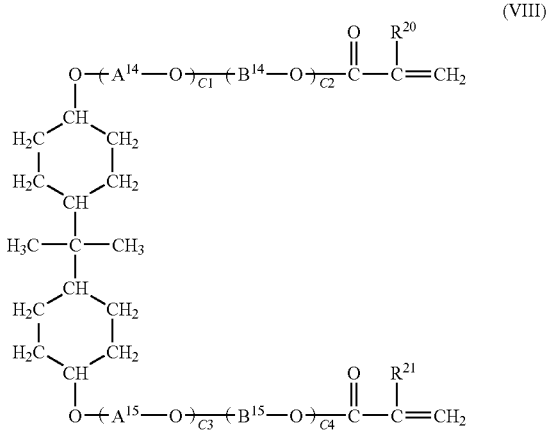

(VIII)

(wherein $R^{20}$ and $R^{21}$ each independently represent hydrogen atom or methyl group, $A^{14}$, $A^{15}$, $B^{14}$ and $B^{15}$ each independently represent a C2-6 alkylene group, wherein the repeating structures -($A^{14}$-O)-, -($A^{15}$-O)-, -($B^{14}$-O)- and -($B^{15}$-O)- may each be random or block, c1, c2, c3 and c4 are each independently an integer of 0 or greater, and c1+c2+c3+c4=2-40), and compounds represented by the following formula (IX):

[Chemical Formula 11]

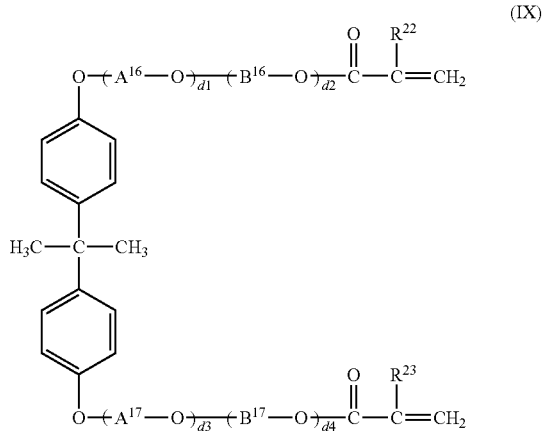

(IX)

(wherein $R^{22}$ and $R^{23}$ each independently represent hydrogen atom or methyl group, $A^{16}$, $A^{17}$, $B^{16}$ and $B^{17}$ each independently represent a C2-6 alkylene group, wherein the repeating structures -($A^{16}$-O)-, -($A^{17}$-O)-, -($B^{16}$-O)- and -($B^{17}$-O)- may each be random or block, d1, d2, d3 and d4 are each independently an integer of 0 or greater, and d1+d2+d3+d4=2-40).

(7) A photosensitive resin composition according to any one of (1) to (6) above, wherein the (d) pyrazoline compound is at least one compound selected from the group consisting of 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

(8) A photosensitive resin laminate comprising a support and a photosensitive resin layer laminated on the support, wherein the photosensitive resin layer is formed using a photosensitive resin composition according to any one of (1) to (7) above.

(9) A method for forming a resist pattern which comprises:
a lamination step in which a photosensitive resin laminate according to (8) above is laminated on a substrate,
an exposure step in which the photosensitive resin layer of the photosensitive resin laminate is exposed to active light, and
a developing step in which the unexposed sections of the photosensitive resin layer are removed by dispersion.

(10) The method for forming a resist pattern according to (9) above, wherein the exposure in the exposure step is accomplished by direct imaging.

(11) The process for producing a printed circuit board, comprising a step of etching or plating a substrate having a resist pattern formed by the method for forming a resist pattern according to (9) or (10) above.

(12) A process for producing a lead frame, comprising a step of etching the board having a resist pattern formed by the method for forming a resist pattern according to (9) or (10) above.

(13) A process for producing a semiconductor package, comprising a step of etching or plating a board having a resist pattern formed by the method for forming a resist pattern according to (9) or (10) above.

(14) A process for producing a concavoconvex board, comprising a step of sand blasting the board having a resist pattern formed by the method for forming a resist pattern according to (9) or (10) above.

Effect of the Invention

The photosensitive resin composition of the invention has satisfactory compatibility during dry film formation, exhibits similar sensitivity for exposure with both i-line radiation and h-line radiation type exposure devices, has excellent resolution and adhesiveness, allows development with aqueous alkali solutions and, according to a specific aspect of the invention, can prevent generation of aggregates during development. The method for forming a resist pattern according to the invention provides resist patterns with excellent sensitivity, resolution and adhesiveness, and can be suitably used for production of printed circuit boards, production of lead frames, production of semiconductor packages, and production of concavoconvex boards for flat-panel displays and the like.

BEST MODE FOR CARRYING OUT THE INVENTION

The invention will now be explained in detail.
<Photosensitive Resin Composition>
According to the first aspect, the photosensitive resin composition of the invention comprises:
(a) 20-90 wt % of a thermoplastic copolymer obtained by copolymerization of a copolymerizing component containing at least one compound selected from the group consisting of compounds represented by the following formula (I):

[Chemical Formula 12]

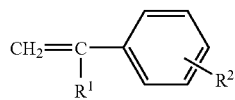

(I)

(wherein $R^1$ represents hydrogen atom or methyl group, and $R^2$ represents a group selected from the group consisting of hydrogen atom, halogen atoms, hydroxyl, C1-12 alkyl, C1-12 alkoxy, carboxyl and haloalkyl groups), and compounds represented by the following formula (II):

[Chemical Formula 13]

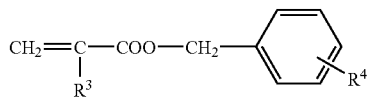

(II)

(wherein $R^3$ represents hydrogen atom or methyl group, and $R^4$ represents a group selected from the group consisting of hydrogen atom, halogen atoms, hydroxyl, C1-12 alkyl, C1-12 alkoxy, carboxyl and haloalkyl groups), and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 14]

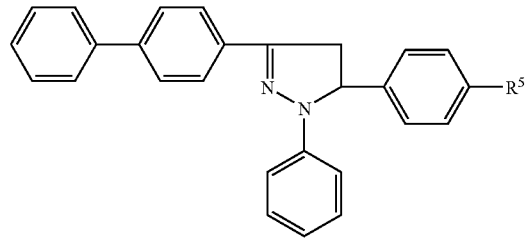

(III)

(wherein $R^5$ represents a C4-12 straight-chain or branched-chain alkyl group).

According to the second aspect, the photosensitive resin composition of the invention comprises:
(a) 20-90 wt % of a thermoplastic copolymer comprising an α,β-unsaturated carboxyl group-containing monomer as a copolymerizing component, and having 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 15]

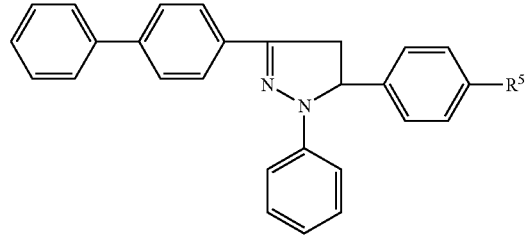

(III)

(wherein $R^5$ represents a C4-12 straight-chain or branched-chain alkyl group),
wherein the (b) addition polymerizable monomer having at least one terminal ethylenic unsaturated group contains at least one addition polymerizable monomer represented by the following formula (V):

[Chemical Formula 16]

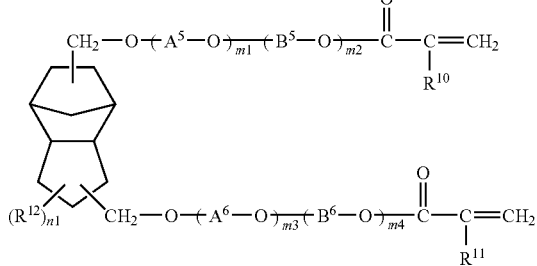

(V)

(wherein $R^{10}$ and $R^{11}$ each independently represent hydrogen atom or methyl group, $R^{12}$ represents a halogen atom or a C1-3 alkyl group, $A^5$, $A^6$, $B^5$ and $B^6$ each independently represent a C2-6 alkylene group, wherein the repeating structures $-(A^5-O)-$, $-(A^6-O)-$, $-(B^5-O)-$ and $-(B^6-O)-$ may each be random or block, m1, m2, m3 and m4 are each independently an integer of 0 or greater, m1+m2+m3+m4=0-40, and n1 is 0-14).

According to the third aspect, the photosensitive resin composition of the invention comprises:
(a) 20-90 wt % of a thermoplastic copolymer comprising an α,β-unsaturated carboxyl group-containing monomer as a copolymerizing component, and having 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 17]

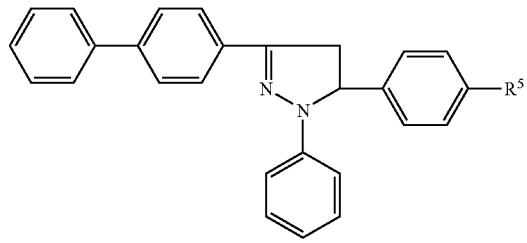

(III)

(wherein $R^5$ represents a C4-12 straight-chain or branched-chain alkyl group),
wherein the (b) addition polymerizable monomer having at least one terminal ethylenic unsaturated group contains at least one selected from the group consisting of compounds represented by the following formula (VIII):

[Chemical Formula 18]

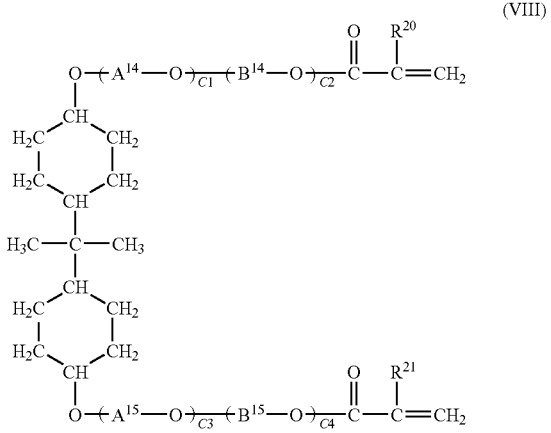

(VIII)

(wherein $R^{20}$ and $R^{21}$ each independently represent hydrogen atom or methyl group, $A^{14}$, $A^{15}$, $B^{14}$ and $B^{15}$ each independently represent a C2-6 alkylene group, wherein the repeating structures $-(A^{14}-O)-$, $-(A^{15}-O)-$, $-(B^{14}-O)-$ and $-(B^{15}-O)-$ may each be random or block, c1, c2, c3 and c4 are each independently an integer of 0 or greater, and c1+c2+c3+c4=2-40), and compounds represented by the following formula (IX):

[Chemical Formula 19]

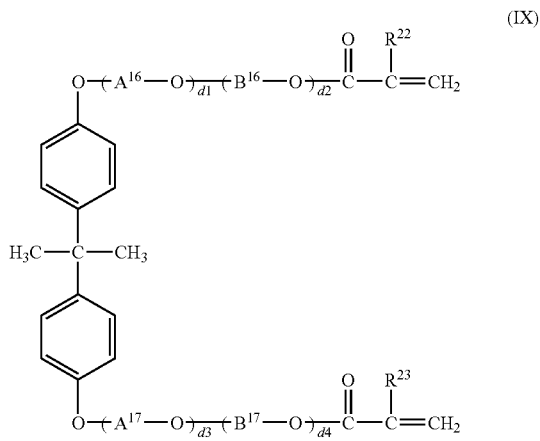

(IX)

(wherein $R^{22}$ and $R^{23}$ each independently represent hydrogen atom or methyl group, $A^{16}$, $A^{17}$, $B^{16}$ and $B^{17}$ each independently represent a C2-6 alkylene group, wherein the repeating structures $-(A^{16}-O)-$, $-(A^{17}-O)-$, $-(B^{16}-O)-$ and $-(B^{17}-O)-$ may each be random or block, d1, d2, d3 and d4 are each independently an integer of 0 or greater, and d1+d2+d3+d4=2-40).

(a) Thermoplastic Copolymer

The (a) thermoplastic copolymer used has a carboxyl group content of 100-600 acid equivalents and a weight-average molecular weight of 5,000-500,000. The carboxyl groups in the thermoplastic copolymer are necessary for the photosensitive resin composition to have a developing property and release property for the developing solution and release solution, which are typically aqueous alkali solutions.

The acid equivalent value of the thermoplastic copolymer is 100-600 and preferably 250-450. From the viewpoint of ensuring compatibility with the coating solvent, the other components in the photosensitive resin composition and the (b) addition polymerizable monomer described hereunder, the acid equivalent value is preferably at least 100, and from the viewpoint of maintaining the developing and release properties it is preferably no greater than 600. Throughout the present specification, the "acid equivalent" value is the weight (grams) of thermoplastic copolymer having 1 equivalent of carboxyl groups. The acid equivalent value is measured by the constant current titration method in 0.1 mol/l aqueous NaOH, using a constant current titration apparatus (for example, a COM-555 Hiranuma Reporting Titrator).

The weight-average molecular weight of the thermoplastic copolymer is 5,000-500,000. The weight-average molecular weight is 5,000 or greater from the viewpoint of maintaining a uniform thickness of the dry film resist and obtaining resistance to the developing solution, and it is no greater than 500,000 from the viewpoint of maintaining the developing property. The weight-average molecular weight is preferably 20,000-100,000. Throughout the present specification, the term "weight-average molecular weight" refers to the weight-average molecular weight measured by gel permeation chromatography (GPC), using a calibration curve for standard polystyrene (for example, Shodex STANDARD SM-105 by Showa Denko K.K.). The weight-average molecular weight can be measured under the following conditions using a gel permeation chromatograph (by JASCO Corp., for example).
Differential refractometer: RI-1530
Pump: PU-1580
Degasser: DG-980-50
Column oven: CO-1560
Column: KF-8025, KF-806 M×2, KF-807, in that order.
Eluent: THF The amount of the (a) thermoplastic polymer in the photosensitive resin composition of the invention is in the range of 20-90 wt % and preferably in the range of 25-70 wt %. The amount is at least 20 wt % from the viewpoint of maintaining the alkali developing property, and it is no greater than 90 wt % from the viewpoint of adequate performance as a resist by the resist pattern formed by exposure.

The (a) thermoplastic copolymer used for the first aspect of the invention is obtained by copolymerizing copolymerizable components comprising as essential components at least one compound selected from the group consisting of:

compounds represented by the following formula (I):

[Chemical Formula 20]

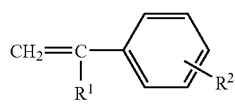

(I)

(wherein $R^1$ represents hydrogen atom or methyl group and $R^2$ represents a group selected from the group consisting of hydrogen atom, halogen atoms, hydroxyl, C1-12 alkyl, C1-12 alkoxy, carboxyl and haloalkyl groups), and compounds represented by the following formula (II):

[Chemical Formula 21]

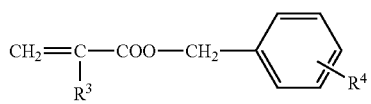

(II)

(wherein $R^3$ represents hydrogen atom or methyl group, and $R^4$ represents a group selected from the group consisting of hydrogen atom, halogen atoms, hydroxyl, C1-12 alkyl, C1-12 alkoxy, carboxyl and haloalkyl groups).

As typical examples of the (a) thermoplastic copolymer to be used for the first aspect of the invention there may be mentioned those obtained by copolymerization of a carboxylic acid component such as an α,β-unsaturated carboxyl group-containing monomer, and at least one component selected from the group consisting of compounds represented by formulas (I) and (II) above. The carboxylic acid component may be a carboxylic acid or a carboxylic anhydride. Such thermoplastic copolymers can be obtained, for example, by copolymerizing one or more monomers selected from among the following first and second monomers.

The first monomer is a carboxylic acid component, which is a carboxylic acid or carboxylic anhydride having one polymerizable unsaturated group in the molecule. As examples of the first monomer there may be mentioned (meth)acrylic acid, fumaric acid, cinnamic acid, crotonic acid, itaconic acid, maleic anhydride and maleic acid half esters. Throughout the present specification, "(meth)acrylic" means "acrylic" and "methacrylic".

The second monomer is a compound having one polymerizable unsaturated group in the molecule. The compound may be selected for the developing property of the photosensitive resin layer, resistance to the etching and plating steps, and retention of properties such as the flexibility of the cured film, and it includes as an essential component at least one selected from the group consisting of compounds represented by formulas (I) and (II). The second monomer will typically be non-acidic (that is, a compound represented by formula (I) or (II) wherein $R^2$ and $R^4$ are not carboxyl groups). Also, the second monomer may be a carboxyl group-containing monomer, while no first monomer is used.

As examples of compounds represented by formula (I) there may be mentioned styrene and styrene derivatives, such as α-methylstyrene, p-hydroxystyrene, p-methylstyrene, p-methoxystyrene, p-chlorostyrene, p-carboxystyrene, p-(2-chloroethyl)styrene and the like.

As examples of compounds represented by formula (II) there may be mentioned benzyl (meth)acrylate, 4-hydroxybenzyl (meth)acrylate, 4-methoxybenzyl (meth)acrylate, 4-methylbenzyl (meth)acrylate, 4-chlorobenzyl (meth)acrylate, p-carboxy (meth)acrylate and p-(2-chloroethyl) (meth) acrylate.

Most preferred among the one or more compounds selected from the group consisting of compounds represented by formulas (I) and (II) is styrene, from the viewpoint of resolution, or benzyl (meth)acrylate, from the viewpoint of resolution and adhesiveness.

The proportion of the one or more compounds selected from the group consisting of compounds represented by formulas (I) and (II), which are copolymerized in each molecule of the (a) thermoplastic copolymer (that is, the proportion of the compound of the entire monomer used to form the (a) thermoplastic copolymer), is preferably between 10 wt % and 95 wt %. The proportion is preferably at least 10 wt % from the viewpoint of resolution and adhesiveness, and it is preferably no greater than 95 wt % from the viewpoint of the developing property. The proportion is more preferably 20 wt % or greater and no greater than 90 wt %, and even more preferably 25 wt % or greater and no greater than 80 wt %.

The (a) thermoplastic copolymer may also include, as the second monomer, other known monomers as copolymerizing components in addition to the one or more compounds selected from the group consisting of compounds represented by formulas (I) and (II) as essential components. As examples of such other monomers there may be mentioned methyl (meth)acrylate, ethyl (meth)acrylate, n-propyl (meth)acrylate, cyclohexyl (meth)acrylate, n-butyl (meth)acrylate, 2-ethylhexyl (meth)acrylate, 2-hydroxyethyl (meth)acrylate, 2-hydroxypropyl (meth)acrylate, 4-hydroxybutyl (meth) acrylate, polyethyleneglycol mono(meth)acrylate, polypropyleneglycol mono(meth)acrylate, (meth) acrylamide, N-methylolacrylamide, N-butoxymethylacrylamide, (meth) acrylonitrile and glycidyl (meth)acrylate, any of which may be used alone or in combinations of two or more. Of these, 2-ethylhexyl (meth)acrylate and 2-hydroxyethyl (meth)acrylate are preferred from the viewpoint of inhibiting aggregates during development.

The proportion of the 2-ethylhexyl (meth)acrylate and 2-hydroxyethyl (meth)acrylate which is copolymerized in each molecule of the (a) thermoplastic copolymer (that is, the proportion of the 2-ethylhexyl (meth)acrylate and 2-hydroxyethyl (meth)acrylate of the entire monomer used to form the (a) thermoplastic copolymer), is preferably 1-30 wt % and more preferably 5-25 wt %. The proportion is preferably at least 1 wt % from the viewpoint of inhibiting aggregates during development, and it is preferably no greater than 30 wt % from the viewpoint of inhibiting cold flow.

The (a) thermoplastic copolymer used for the second and third aspects of the invention comprises an α,β-unsaturated carboxyl group-containing monomer as a copolymerizing component. The thermoplastic copolymer is preferably a homopolymer or copolymer of one or more first monomers described below, or a copolymer of one or more first monomers and one or more second monomers described below.

The first monomer is a monomer containing an α,β-unsaturated carboxyl group in the molecule. As examples of the first monomer there may be mentioned (meth)acrylic acid, fumaric acid, cinnamic acid, crotonic acid, itaconic acid, maleic anhydride and maleic acid half esters. (Meth)acrylic acid is preferred among these.

The second monomer is a monomer that is non-acidic and has at least one polymerizable unsaturated group in the molecule. As examples of the second monomer there may be mentioned methyl (meth)acrylate, ethyl (meth)acrylate, n-propyl (meth)acrylate, iso-propyl (meth)acrylate, n-butyl (meth)acrylate, iso-butyl (meth)acrylate, benzyl (meth)acrylate, tert-butyl (meth)acrylate, 2-hydroxyethyl (meth)acrylate, 2-hydroxypropyl (meth)acrylate, 2-ethylhexyl (meth)acrylate and vinyl alcohol esters such as vinyl acetate, (meta)acrylonitrile, styrene, and polymerizable styrene derivatives. Methyl (meth)acrylate, n-butyl (meth)acrylate and styrene are preferred among these.

The (a) thermoplastic copolymer is preferably synthesized by mixing the monomers to be used for the invention, such as the first monomer and second monomer described above, adding a solvent such as acetone, methyl ethyl ketone or isopropanol to the obtained mixture for dilution, adding a suitable amount of a radical polymerization initiator, such as benzoyl peroxide or azoisobutyronitrile, to the obtained solution, and heating and stirring the mixture. The synthesis may also be carried out while adding a portion of the mixture dropwise to the reaction mixture. Upon completion of the reaction, additional solvent may be added for adjustment to the desired concentration. The synthesis means used may be bulk polymerization, suspension polymerization or emulsion polymerization, instead of the solution polymerization described above.

(b) Addition Polymerizable Monomer

The amount of the (b) addition polymerizable monomer in the photosensitive resin composition of the invention is in the range of 5-75 wt % and more preferably in the range of 15-60 wt %. The amount is at least 5 wt % from the viewpoint of inhibiting curing defects and developing time retardation, and it is no greater than 75 wt % from the viewpoint of inhibiting cold flow and retardation of release of the hardened resist.

The (b) addition polymerizable monomer used according to the first aspect of the invention may be, for example, 4-nonylphenylheptaethyleneglycol dipropyleneglycol acrylate, 2-hydroxy-3-phenoxypropyl acrylate, phenoxyhexaethyleneglycol acrylate, reaction products from phthalic anhydride and 2-hydroxypropyl acrylate half ester compounds and propylene oxide (for example, trade name: OE-A200 by Nippon Shokubai Co., Ltd.), 4-normal-octylphenoxypentapropyleneglycol acrylate, 2,2-bis(4-(meth)acryloxypolyoxyalkyleneglycolphenyl)propane, 2,2-bis(4-(meth)acryloxypolyoxyalkyleneglycolcyclohexyl)propane, pentaerythritol penta (meth)acrylate, trimethylolpropanetriglycidyl ether tri(meth)acrylate, 1,6-hexanediol (meth)acrylate, 1,4-cyclohexanediol di(meth)acrylate, or polyoxyalkyleneglycol di(meth)acrylates such as polypropyleneglycol di(meth)acrylate, polyethyleneglycol di(meth)acrylate, polyoxyethylenepolyoxypropyleneglycol di(meth)acrylate, 2-di(p-hydroxyphenyl)propane di(meth)acrylate, glycerol tri(meth)acrylate, urethane group-containing polyfunctional group (meth)acrylates, urethanated products of hexamethylene diisocyanate and nonapropyleneglycol monomethacrylate, and polyfunctional (meth)acrylates of isocyanuric acid ester compounds. These may be used alone or in combinations of two or more.

The (b) addition polymerizable monomer used for the second aspect of the invention contains at least one addition polymerizable monomer represented by the following formula (V):

[Chemical Formula 22]

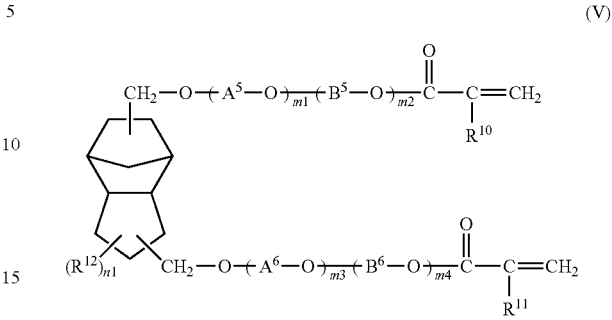

(V)

(wherein $R^{10}$ and $R^{11}$ each independently represent hydrogen atom or methyl group, $R^{12}$ represents a halogen atom or a C1-3 alkyl group, $A^5$, $A^6$, $B^5$ and $B^6$ each independently represent a C2-6 alkylene group, wherein the repeating structures $-(A^5\text{-}O)-$, $-(A^6\text{-}O)-$, $-(B^5\text{-}O)-$ and $-(B^6\text{-}O)-$ may each be random or block, m1, m2, m3 and m4 are each independently an integer of 0 or greater, m1+m2+m3+m4=0-40, and n1 is 0-14).

As specific examples of compounds represented by formula (V) there may be mentioned tricyclodecanedimethanol diacrylate (NK Ester A-DCP by Shin-Nakamura Chemical Co., Ltd.) and tricyclodecanedimethanol dimethacrylate (NK Ester DCP by Shin-Nakamura Chemical Co., Ltd.). These may be used alone or in combinations of two or more.

The content of the compound represented by formula (V) in the photosensitive resin composition is preferably 5-40 wt % and more preferably 10-30 wt %. From the viewpoint of exhibiting high resolution and high adhesiveness, the content is preferably at least 5 wt %, and from the viewpoint of inhibiting cold flow and retardation of release of the hardened resist it is preferably no greater than 40 wt %.

According to the second aspect of the invention, the (b) addition polymerizable monomer used may be a combination of an addition polymerizable monomer represented by formula (V) and at least one (b) addition polymerizable monomer used for the first aspect, which does not have the structure represented by formula (V).

From the viewpoint of resolution and adhesiveness, the (b) addition polymerizable monomer used for the second aspect of the invention preferably contains at least one selected from the group consisting of compounds represented by the following formula (VI):

[Chemical Formula 23]

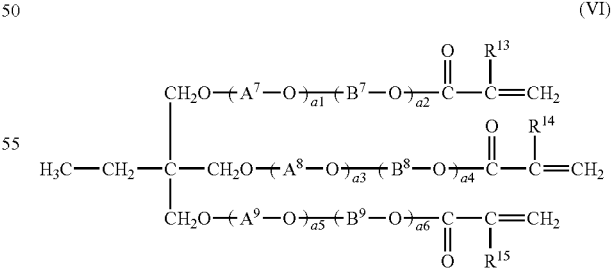

(VI)

(wherein $R^{13}$, $R^{14}$ and $R^{15}$ each independently represent hydrogen atom or methyl group, $A^7$, $A^8$, $A^9$, $B^7$, $B^8$ and $B^9$ each independently represent a C2-6 alkylene group, wherein the repeating structures $-(A^7\text{-}O)-$, $-(A^8\text{-}O)-$, $-(A^9\text{-}O)-$, $-(B^7\text{-}O)-$, $-(B^8\text{-}O)-$ and $-(B^9\text{-}O)-$ may each be random or block, a1, a2, a3, a4, a5 and a6 are each independently an integer of 0 or greater, and a1+a2+a3+a4+a5+a6=0-50), and compounds represented by the following formula (VII):

[Chemical Formula 24]

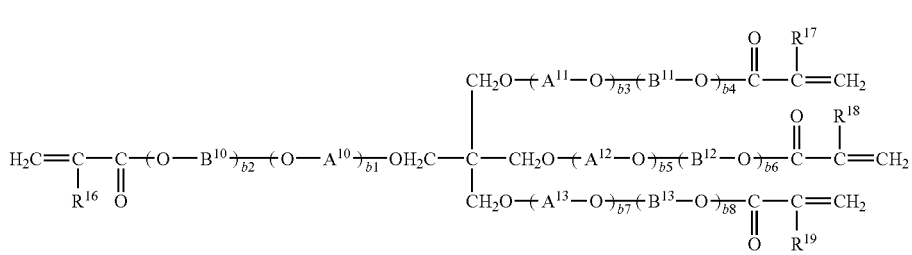

(VII)

(wherein $R^{16}$, $R^{17}$, $R^{18}$ and $R^{19}$ each independently represent hydrogen atom or methyl group, $A^{10}$, $A^{11}$, $A^{12}$, $A^{13}$, $B^{10}$, $B^{11}$, $B^{12}$ and $B^{13}$ each independently represent a C2-6 alkylene group, wherein the repeating structures -($A^{10}$-O)-, ($A^{11}$-O)-, ($A^{12}$-O-)-, ($A^{13}$-O)-, ($B^{10}$-O)-, ($B^{11}$-O)-, ($B^{12}$-O)- and -($B^{13}$-O)- may each be random or block, b1, b2, b3, b4, b5, b6, b7 and b8 are each independently an integer of 0 or greater, and b1+b2+b3+b4+b5+b6+b7+b8=0-60).

As examples of compounds represented by formula (VI) there may be mentioned trimethylolpropane tri(meth)acrylate and polyoxyethyltrimethylolpropane tri(meth)acrylate. These may be used alone or in combinations of two or more. Triethoxytrimethylolpropane triacrylate is most preferred of these.

As examples of compounds represented by formula (VII) there may be mentioned pentaerythritol tetra(meth)acrylate and pentaerythritolethoxylated tetra(meth)acrylate. These may be used alone or in combinations of two or more. Pentaerythritolethoxylated tetraacrylate is most preferred of these.

When at least one compound selected from the group consisting of compounds represented by formula (VI) and compounds represented by formula (VII) is included, the content of these compounds in the photosensitive resin composition is preferably 1-40 wt % and more preferably 5-30 wt %. From the viewpoint of exhibiting high resolution and high adhesiveness, the content is preferably at least 1 wt %, and from the viewpoint of inhibiting cold flow and retardation of release of the hardened resist it is preferably no greater than 40 wt %.

From the viewpoint of resolution and adhesiveness, the (b) addition polymerizable monomer used for the third aspect of the invention comprises as an essential component at least one compound selected from the group consisting of compounds represented by the following formula (VIII):

[Chemical Formula 25]

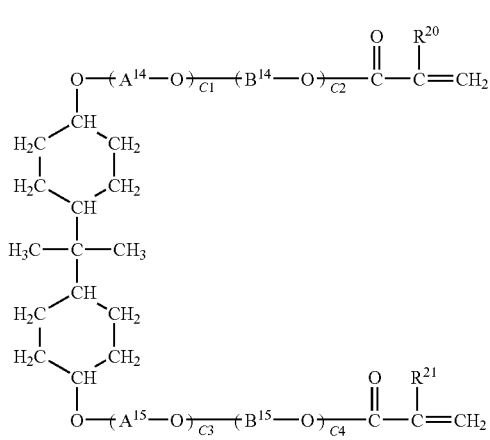

(VIII)

(wherein $R^{20}$ and $R^{21}$ each independently represent hydrogen atom or methyl group, $A^{14}$, $A^{15}$, $B^{14}$ and $B^{15}$ each independently represent a C2-6 alkylene group, the repeating structures -($A^{14}$-O)-, -($A^{15}$-O)-, -($B^{14}$-O)- and -($B^{15}$-O)- may each be random or block, c1, c2, c3 and c4 are each independently an integer of 0 or greater and c1+c2+c3+c4=2-40), and compounds represented by the following formula (IX):

[Chemical Formula 26]

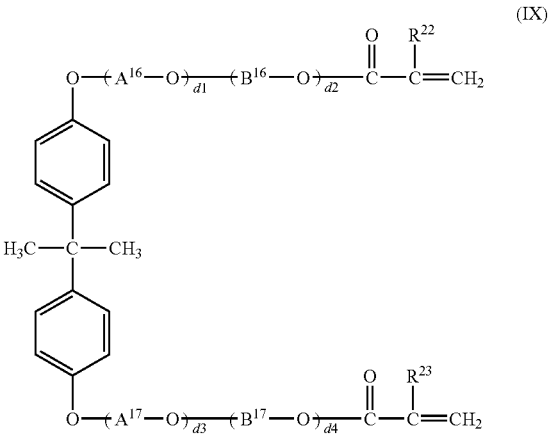

(IX)

(wherein $R^{22}$ and $R^{23}$ each independently represent hydrogen atom or methyl group, $A^{16}$, $A^{17}$, $B^{16}$ and $B^{17}$ each independently represent a C2-6 alkylene group, the repeating structures -($A^{16}$-O)-, -($A^{17}$-O)-, -($B^{16}$-O)- and -($B^{17}$-O)- may each be random or block, d1, d2, d3 and d4 are each independently an integer of 0 or greater, and d1+d2+d3+d4=2-40).

As specific examples of compounds represented by formula (VIII) there may be mentioned 2,2-bis{(4-acryloxypolyethyleneoxy)cyclohexyl}propane and 2,2-bis{(4-methacryloxypolyethyleneoxy)cyclohexyl}propane. The polyethyleneoxy group in the compound is preferably a group selected from the group consisting of monoethyleneoxy, diethyleneoxy, triethyleneoxy, tetraethyleneoxy, pentaethyleneoxy, hexaethyleneoxy, heptaethyleneoxy, octaethyleneoxy, nonaethyleneoxy, decaethyleneoxy, undecaethyleneoxy, dodecaethyleneoxy, tridecaethyleneoxy, tetradecaethyleneoxy and pentadecaethyleneoxy groups.

As compounds represented by formula (VIII) there may be mentioned 2,2-bis{(4-acryloxypolyalkyleneoxy)cyclohexyl}propane and 2,2-bis{(4-methacryloxypolyalkyleneoxy)cyclohexyl}propane. The polyalkyleneoxy groups in the compound may be a mixture of ethyleneoxy and propyleneoxy groups. Such compounds are preferably addition products obtained by addition of octaethyleneoxy groups and dipropyleneoxy groups in a block structure or random structure, addition products obtained by addition of tetraethyleneoxy groups and tetrapropyleneoxy groups in a block structure or random structure, or addition products obtained by addition of pentadecaethyleneoxy groups and dipropyleneoxy groups in a block structure or random structure. The total of c1, c2, c3 and c4 in formula (VIII) is more preferably 2-30. Most preferred among these is 2,2-bis{(4-methacryloxypentaethyleneoxy)cyclohexyl}propane.

As specific examples of compounds represented by formula (IX) there may be mentioned 2,2-bis{(4-acryloxypolyethyleneoxy)phenyl}propane and 2,2-bis{(4-methacryloxypolyethyleneoxy)phenyl}propane. The polyethyleneoxy group in the compound is preferably a group selected from the group consisting of monoethyleneoxy, diethyleneoxy, triethyleneoxy, tetraethyleneoxy, pentaethyleneoxy, hexaethyleneoxy, heptaethyleneoxy, octaethyleneoxy, nonaethyleneoxy, decaethyleneoxy, undecaethyleneoxy, dodecaethyleneoxy, tridecaethyleneoxy, tetradecaethyleneoxy and pentadecaethyleneoxy groups.

As compounds represented by formula (IX) there may be mentioned 2,2-bis{(4-acryloxypolyalkyleneoxy)phenyl}propane and 2,2-bis{(4-methacryloxypolyalkyleneoxy)phenyl}propane. The polyalkyleneoxy groups in the compound may be a mixture of ethyleneoxy and propyleneoxy groups. Such compounds are preferably addition products obtained by addition of octaethyleneoxy groups and dipropyleneoxy groups in a block structure or random structure, addition products obtained by addition of tetraethyleneoxy groups and tetrapropyleneoxy groups in a block structure or random structure, or addition products obtained by addition of pentadecaethyleneoxy groups and dipropyleneoxy groups in a block structure or random structure. In formula (IX), d1, d2, d3 and d4 are 0 or positive integers, and the total of d1, d2, d3 and d4 is preferably 2-30. Most preferred among these is 2,2-bis{(4-methacryloxypentaethyleneoxy)phenyl}propane. These (b) addition polymerizable monomers may be used alone or in combinations of two or more.

When at least one compound selected from the group consisting of compounds represented by formula (VIII) and compounds represented by formula (IX) is included, the content of these compounds in the photosensitive resin composition is preferably 5-40 wt % and more preferably 10-30 wt %. From the viewpoint of exhibiting high resolution and high adhesiveness, the content is preferably at least 5 wt %, and from the viewpoint of inhibiting cold flow and retardation of release of the hardened resist it is preferably no greater than 40 wt %.

According to the third aspect of the invention, the (b) addition polymerizable monomer used may be a combination of a compound represented by formula (VIII) or (IX), and at least one compound which is (b) an addition polymerizable monomer used for the first aspect that does not have a structure represented by formula (VIII) or (IX).

(c) Photopolymerization Initiator

The photosensitive resin composition of the invention comprises (c) a photopolymerization initiator, with a triarylimidazolyl dimer as an essential component. As examples of triarylimidazolyl dimers there may be mentioned 2-(o-chlorophenyl)-4,5-diphenylimidazolyl dimer, 2,2',5-tris-(o-chlorophenyl)-4-(3,4-dimethoxyphenyl)-4',5'-diphenylimidazolyl dimer, 2,4-bis-(o-chlorophenyl)-5-(3,4-dimethoxyphenyl)-diphenylimidazolyl dimer, 2,4,5-tris-(o-chlorophenyl)-diphenylimidazolyl dimer, 2-(o-chlorophenyl)-bis-4,5-(3,4-dimethoxyphenyl)-imidazolyl dimer, 2,2'-bis-(2-fluorophenyl)-4,4',5,5'-tetrakis-(3-methoxyphenyl)-imidazolyl dimer and 2,2'-bis-(2,3-difluoromethylphenyl)-4,4',5,5'-tetrakis-(3-methoxyphenyl)-imidazolyl dimer, 2,2'-bis-(2,4-difluorophenyl)-4,4',5,5'-tetrakis-(3-methoxyphenyl)-imidazolyl dimer, 2,2'-bis-(2,5-difluorophenyl)-4,4',5,5'-tetrakis-(3-methoxyphenyl)-imidazolyl dimer, 2,2'-bis-(2,6-difluorophenyl)-4,4',5,5'-tetrakis-(3-methoxyphenyl)-imidazolyl dimer, 2,2'-bis-(2,3,4-trifluorophenyl)-4,4',5,5'-tetrakis-(3-methoxyphenyl)-imidazolyl dimer, 2,2'-bis-(2,3,5-trifluorophenyl)-4,4',5,5'-tetrakis-(3-methoxyphenyl)-imidazolyl dimer, 2,2'-bis-(2,3,6-trifluorophenyl)-4,4',5,5'-tetrakis-(3-methoxyphenyl)-imidazolyl dimer, 2,2'-bis-(2,4,5-trifluorophenyl)-4,4',5,5'-tetrakis-(3-methoxyphenyl)-imidazolyl dimer, 2,2'-bis-(2,4,6-trifluorophenyl)-4,4',5,5'-tetrakis-(3-methoxyphenyl)-imidazolyl dimer, 2,2'-bis-(2,3,4,5-tetrafluorophenyl)-4,4',5,5'-tetrakis-(3-methoxyphenyl)-imidazolyl dimer, 2,2'-bis-(2,3,4,6-tetrafluorophenyl)-4,4',5,5'-tetrakis-(3-methoxyphenyl)-imidazolyl dimer and 2,2'-bis-(2,3,4,5,6-pentafluorophenyl)-4,4',5,5'-tetrakis-(3-methoxyphenyl)-imidazolyl dimer. Particularly preferred for use is 2-(o-chlorophenyl)-4,5-diphenylimidazolyl dimer, which is a photopolymerization initiator exhibiting a high effect for resolution and cured film strength. These may be used alone or as combinations of two or more types.

The amount of triarylimidazolyl dimer in the photosensitive resin composition of the invention is preferably 0.01-30 wt %, more preferably 0.05-10 wt % and most preferably 0.1-5 wt %. The amount is preferably at least 0.01 wt % from the viewpoint of obtaining sufficient sensitivity, and it is preferably no greater than 30 wt % from the viewpoint of maintaining high resolution.

The photosensitive resin composition of the invention may include combinations with photopolymerization initiators other than triarylimidazolyl dimers. As examples of such photopolymerization initiators there may be mentioned quinones, 2-ethylanthraquinone, octaethylanthraquinone, 1,2-benzanthraquinone, 2,3-benzanthraquinone, 2-phenylanthraquinone, 2,3-diphenylanthraquinone, 1-chloroanthraquinone, 1,4-naphthoquinone, 9,10-phenanthraquinone, 2-methyl-1,4-naphthoquinone, 2,3-dimethylanthraquinone, 3-chloro-2-methylanthraquinone, aromatic ketones such as benzophenone, Michler's ketone[4,4'-bis(dimethylamino)benzophenone] and 4,4'-bis(diethylamino)benzophenone, benzoin, benzoin ethers such as benzomethyl ether and benzoinphenyl ether, methylbenzoin, ethylbenzoin, benzyldimethylketal, benzyldiethylketal, N-phenylglycines such as N-phenylglycine, N-methyl-N-phenylglycine and N-ethyl-N-phenylglycine, combinations of thioxanthones and alkylaminobenzoic acids, such as combinations of ethylthioxanthone and dimethylethyl aminobenzoate, combinations of 2-chlorthioxanthone and dimethylethyl aminobenzoate and combinations of isopropylthioxanthone and dimethylethyl aminobenzoate,
oxime esters such as 1-phenyl-1,2-propanedione-2-O-benzoinoxime and 1-phenyl-1,2-propanedione-2-(O-ethoxycarbonyl)oxime, acridines such as 1,7-bis(9-acridinyl)heptane (N-1717 by Adeka Corp.) and 9-phenylacridine, thioxanthones such as diethylthioxanthone, isopropylthioxanthone and chlorthioxanthone, and dialkylaminobenzoic acid esters such as ethyl dimethylaminobenzoate and ethyl diethylaminobenzoate.

Michler's ketone and 4,4'-bis(diethylamino)benzophenone are particularly preferred among these.

The content of the photopolymerization initiator comprising the (c) triarylimidazolyl dimer is in the range of 0.01-30 wt %. The preferred content is 0.05-10 wt %, with the range of 0.1-5 wt % being most preferred. The amount must be at least 0.01 wt % from the viewpoint of obtaining sufficient sensitivity, and no greater than 30 wt % from the viewpoint of maintaining high resolution.

(d) Pyrazoline Compound

The photosensitive resin composition of the invention comprises as an essential component (d) a pyrazoline compound represented by the following formula (III):

[Chemical Formula 27]

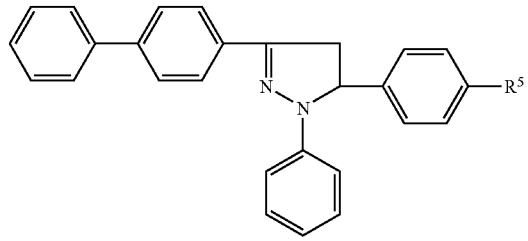

(III)

(wherein $R^5$ represents a C4-12 straight-chain or branched-chain alkyl group).

As examples of compounds represented by formula (III) there may be mentioned 1-phenyl-3-(4-biphenyl)-5-(4-n-butyl-phenyl)-pyrazoline, 1-phenyl-3-(4-biphenyl)-5-(4-tert-butyl-phenyl)-pyrazoline, 1-phenyl-3-(4-biphenyl)-5-(4-isobutyl-phenyl)-pyrazoline, 1-phenyl-3-(4-biphenyl)-5-(4-n-pentyl-phenyl)-pyrazoline, 1-phenyl-3-(4-biphenyl)-5-(4-isopentyl-phenyl)-pyrazoline, 1-phenyl-3-(4-biphenyl)-5-(4-neopentyl-phenyl)-pyrazoline, 1-phenyl-3-(4-biphenyl)-5-(4-hexyl-phenyl)-pyrazoline, 1-phenyl-3-(4-biphenyl)-5-(4-heptyl-phenyl)-pyrazoline, 1-phenyl-3-(4-biphenyl)-5-(4-n-octyl-phenyl)-pyrazoline, 1-phenyl-3-(4-biphenyl)-5-(4-tert-octyl-phenyl)-pyrazoline, 1-phenyl-3-(4-biphenyl)-5-(4-nonyl-phenyl)-pyrazoline, 1-phenyl-3-(4-biphenyl)-5-(4-decyl-phenyl)-pyrazoline, 1-phenyl-3-(4-biphenyl)-5-(4-undecyl-phenyl)-pyrazoline and 1-phenyl-3-(4-biphenyl)-5-(4-dodecyl-phenyl)-pyrazoline.

Preferred among the compounds represented by formula (III) are 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

One or more compounds represented by formula (III) may be present in the photosensitive resin composition of the invention. The content of compounds represented by formula (III) in the photosensitive resin composition is in the range of 0.001-10 wt %, with the preferred range being 0.005-5 wt % and the most preferred range being 0.05-2 wt %. The content is at least 0.001 wt % from the viewpoint of improving sensitivity and resolution, while it is no greater than 10 wt % from the viewpoint of improving the compatibility and dispersibility in the (a) thermoplastic polymer and the (b) addition polymerizable monomer with a terminal ethylenic unsaturated group, and exhibiting an effect as a dry film photoresist. According to the invention, the (d) pyrazoline compound is used together with the (c) photopolymerization initiator containing a triarylimidazolyl dimer to exhibit an effect as a sensitizing agent.

(e) Other Components

From the viewpoint of further inhibiting aggregates during development with the photosensitive resin composition of the invention, it preferably further comprises at least one compound represented by the following formula (IV):

[Chemical Formula 28]

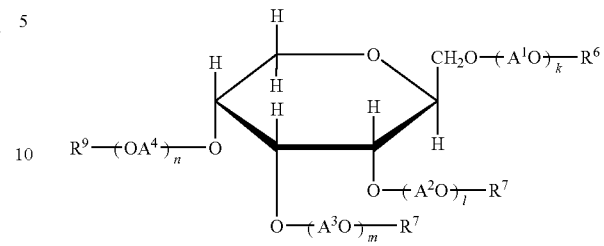

(IV)

(wherein $R^6$, $R^7$, $R^8$ and $R^9$ each independently represent hydrogen atom or a C1-30 fatty acid acyl group, $A^1$, $A^2$, $A^3$ and $A^4$ are each independently —CH(CH$_3$)CH$_2$—, —CH$_2$CH(CH$_3$)— or —CH$_2$CH$_2$—, wherein the repeating structures -($A^1$-O)-, -($A^2$-O)-, -($A^3$-O)- and -($A^4$-O)- may each be random or block, k, l, m and n are each independently an integer of 0 or greater, and k+l+m+n=0-40).

As C1-30 fatty acid acyl groups there may be mentioned C1-30 saturated fatty acid acyl and C1-30 unsaturated fatty acid acyl groups. As examples of C1-30 saturated fatty acid acyl groups there may be mentioned formyl, acetyl, propionyl, butyryl, lauryl, myristyl, palmityl and stearyl. As examples of C1-30 unsaturated fatty acid acyl groups there may be mentioned acryl, propynoyl, methacryl and oleyl groups.

The following compounds may be mentioned as compounds represented by formula (IV). As ester-type compounds there may be mentioned sorbitan laurate [$R_6$: lauryl, $R_7$=$R_8$=$R_9$: hydrogen, k+l+m+n=0 (example: NEWCOL™ 20 by Nippon Nyukazai Co., Ltd.)], sorbitan stearate [$R_6$: stearyl, $R_7$=$R_8$=$R_9$: hydrogen, k+l+m+n=0 (example: IONET™ S-60C by Sanyo Chemical Industries, Ltd.)], sorbitan oleate [$R_6$: oleyl, $R_7$=$R_8$=$R_9$: hydrogen, k+l+m+n=0 (example: IONET™ S-80C by Sanyo Chemical Industries, Ltd.)], sorbitan palmitate [$R_6$: palmityl, $R_7$=$R_8$=$R_9$: hydrogen, k+l+m+n=0 (example: SORBON™ S-40 by Toho Chemical Industry Co., Ltd.)], sorbitan coconut oil fatty acid ester [$R_6$: acyl group of coconut oil fatty acid (coconut oil being a fatty acid obtained from the flesh of coconut stone, with fatty acids as a mixture of saturated fatty acids such as lauric acid and myristic acid and unsaturated fatty acids such as oleic acid and linolic acid), $R_7$=$R_8$=$R_9$: hydrogen, k+l+m+n=0 (example: IONET™ S-20 by Sanyo Chemical Industries, Ltd.), and sorbitan trioleate [$R_6$=$R_7$=$R_9$: oleyl, $R_8$: hydrogen, k+l+m+n=0 (example: IONET™ S-85 by Sanyo Chemical Industries, Ltd.), as well as mixtures of the foregoing.

As compounds with sorbitan and oxyethylene chain combinations there may be mentioned polyoxyethylenesorbitan laurate [$R_6$: lauryl, $R_7$=$R_8$=$R_9$: hydrogen, k+l+m+n=20, $A^1$-$A^4$: —CH$_2$CH$_2$— (example: NEWCOL™ 25 by Nippon Nyukazai Co., Ltd.)], polyoxyethylenesorbitan stearate [$R_6$: stearyl, $R_7$=$R_8$=$R_9$: hydrogen, k+l+m+n=20, $A^1$-$A^4$: —CH$_2$CH$_2$— (example: IONET™ T-60C by Sanyo Chemical Industries, Ltd.)], polyoxyethylenesorbitan oleate [$R_6$: oleyl, $R_7$=$R_8$=$R_9$: hydrogen, k+l+m+n=8 or 20, $A^1$-$A^4$: —CH$_2$CH$_2$— (example: NEWCOL™ 82 or 85 by Nippon Nyukazai Co., Ltd.)], polyoxyethylenesorbitan palmitate [$R_6$: palmityl, $R_7$=$R_8$=$R_9$: hydrogen, k+l+m+n=20, $A^1$-$A^4$: —CH$_2$CH$_2$— (example: SORBON™ T-40 by Toho Chemical Industry Co., Ltd.)], polyoxyethylenesorbitan trioleate [$R_6$=$R_7$=$R_9$: oleyl, $R_8$: hydrogen, k+l+m+n=20, $A^1$-$A^4$: —CH$_2$CH$_2$— (example: NEWCOL™ 3-85 by Nippon Nyukazai Co., Ltd.)], polyoxyethylenesorbitan coconut oil fatty acid ester [$R_6$: acyl group of coconut oil fatty acid, $R_7=R_8=R_9$: hydrogen, k+l+m+n=20, $A^1$-$A^4$: —$CH_2CH_2$— (example: IONET™ T-20C by Sanyo Chemical Industries, Ltd.)], polyalkylenesorbitan fatty acid ester [$R_6$: acyl group of mixed fatty acid (oleic acid: 66%, stearic acid: 2%, C20 saturated and unsaturated fatty acids: 18%, C1-6 saturated and unsaturated fatty acids: 7%, >C20 saturated and unsaturated fatty acids: 7%), $R_7=R_8=R_9$: hydrogen, k+l+m+n=30, $A^1$-$A^4$: —$CH_2CH_2$—/—$CH(CH_3)CH_2$— or $CH_2CH(CH_3)$—=2/1 (example: NEWCOL™ 95-FJ by Nippon Nyukazai Co., Ltd.)], and mixtures of the foregoing.

The compounds represented by formula (IV) may be used alone or in combinations of two or more.

When a compound represented by formula (IV) is present, the content of the compound in the photosensitive resin composition is preferably 0.01-30 wt %, and more preferably in the range of 0.1-15 wt %. From the viewpoint of obtaining a satisfactory reducing effect against aggregates during development, the content is preferably at least 0.01 wt %, and from the viewpoint of sensitivity and resolution it is preferably no greater than 30 wt %.

Coloring substances such as dyes and pigments may also be used in the photosensitive resin composition, in addition to the components mentioned above. As examples of such coloring substances there may be mentioned Phthalocyanine green, Crystal violet, Methyl orange, Nile blue 2B, Victoria blue, Malachite green, Basic blue 20, Diamond green and the like.

A leuco dye may also be added to the photosensitive resin composition to allow a visible image to be imparted by exposure. As such leuco dyes there may be mentioned leuco crystal violet and fluorane dyes. Contrast is more satisfactory when leuco crystal violet is used. As examples of fluorane dyes there may be mentioned 3-diethylamino-6-methyl-7-anilinofluorane, 3-dibutylamino-6-methyl-7-anilinofluorane, 2-(2-chloroanilino)-6-dibutylaminofluorane, 2-bromo-3-methyl-6-dibutylaminofluorane, 2-N,N-dibenzylamino-6-diethylaminofluorane, 3-diethylamino-7-chloroaminofluorane, 3,6-dimethoxyfluorane and 3-diethylamino-6-methoxy-7-aminofluorane.

Using a leuco dye and a halogenated compound in combination in the photosensitive resin composition is a preferred embodiment of the invention from the viewpoint of adhesiveness and contrast.

As examples of halogenated compounds there may be mentioned amyl bromide, isoamyl bromide, isobutylene bromide, ethylene bromide, diphenylmethyl bromide, benzal bromide, methylene bromide, tribromomethylphenylsulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, hexachloroethane and halogenated triazine compounds.

The content of a halogenated compound in the photosensitive resin composition, when a halogenated compound is used, is preferably in the range of 0.01-5 wt %.

The content of the coloring substance and leuco dye is preferably in the range of 0.01-10 wt % each in the photosensitive resin composition. From the viewpoint of allowing sufficient visibility of coloration (color development) the content is preferably at least 0.01 wt %, and from the viewpoint of contrast of the unexposed sections against the exposed sections, and maintaining storage stability, it is preferably no greater than 10 wt %.

In order to improve the thermostability and storage stability of the photosensitive resin composition of the invention, it is preferred to include a radical polymerization inhibitor or benzotriazole in the photosensitive resin composition.

As examples of radical polymerization inhibitors there may be mentioned p-methoxyphenol, hydroquinone, pyrogallol, naphthylamine, tert-butylcatechol, cuprous chloride, 2,6-di-tert-butyl-p-cresol, 2,2'-methylenebis(4-methyl-6-tert-butylphenol), 2,2'-methylenebis(4-ethyl-6-tert-butylphenol), nitrosophenylhydroxyaminealuminum salts, diphenylnitrosoamine, and the like.

As examples of benzotriazoles there may be mentioned 1,2,3-benzotriazole, 1-chloro-1,2,3-benzotriazole, bis (N-2-ethylhexyl)aminomethylene-1,2,3-benzotriazole, bis (N-2-ethylhexyl)aminomethylene-1,2,3-tolyltriazole and bis(N-2-hydroxyethyl)aminomethylene-1,2,3-benzotriazole. As examples of carboxybenzotriazoles there may be mentioned 4-carboxy-1,2,3-benzotriazole, 5-carboxy-1,2,3-benzotriazole, N—(N,N-di-2-ethylhexyl)aminomethylenecarboxybenzotriazole, N—(N,N-di-2-hydroxyethyl)aminomethylenecarboxybenzotriazole and N—(N,N-di-2-ethylhexyl)aminoethylenecarboxybenzotriazole.

The total content of radical polymerization inhibitors and benzotriazoles is in the range of preferably 0.01-3 wt %, and more preferably 0.05-1 wt %. The amount is preferably at least 0.01 wt % from the viewpoint of imparting storage stability to the photosensitive resin composition, and it is preferably no greater than 3 wt % from the viewpoint of maintaining photosensitivity.

These radical polymerization inhibitors and benzotriazole compounds may be used alone or in combinations of two or more.

The photosensitive resin composition of the invention may also contain a plasticizer if necessary. As examples of plasticizers there may be mentioned glycol esters; for example, polyethylene glycol, polypropylene glycol, polyoxypropylenepolyoxyethylene ether, polyoxyethylenemonomethyl ether, polyoxypropylenemonomethyl ether, polyoxyethylenepolyoxypropylenemonomethyl ether, polyoxyethylenemonoethyl ether, polyoxypropylenemonoethyl ether and polyoxyethylenepolyoxypropylenemonoethyl ether, and phthalic acid esters, for example, diethyl phthalate, o-toluenesulfonamide, p-toluenesulfonamide, tributyl citrate, triethyl citrate, acetyltriethyl citrate, acetyltri-n-propyl citrate and acetyltri-n-butyl citrate.

The content of a plasticizer in the photosensitive resin composition is in the range of preferably 5-50 wt % and more preferably 5-30 wt %. From the viewpoint of inhibiting developing time retardation and imparting softness to the cured film, the content is preferably at least 5 wt %, and from the viewpoint of inhibiting curing defects and cold flow it is preferably no greater than 50 wt %.

The photosensitive resin composition of the invention may also contain a solvent to prepare a uniformly dissolved solution of components (a)-(e). As solvents to be used there may be mentioned ketones such as methyl ethyl ketone (MEK), and alcohols such as methanol, ethanol and isopropyl alcohol. The solvent is preferably used so that the viscosity of the prepared solution of the photosensitive resin composition is 500-4000 mPa·sec at 25° C.

<Photosensitive Resin Laminate>

The present invention further provides a photosensitive resin laminate comprising a support and a photosensitive resin layer laminated on the support, wherein the photosensitive resin layer is formed using a photosensitive resin composition of the invention as described above. The photosensitive resin laminate of the invention comprises a photosensitive resin layer formed using the photosensitive resin composition of the invention and a support that supports the layer, but if necessary it may also have a protective layer on the surface of the photosensitive resin layer opposite the support side. The support is preferably a transparent one that transmits light emitted from the exposure light source. As examples of such supports there may be mentioned polyethylene terephthalate films, polyvinyl alcohol films, polyvinyl chloride films, vinyl chloride copolymer films, polyvinylidene chloride films, vinylidene chloride copolymerization films, polymethyl methacrylate copolymer films, polystyrene films, polyacrylonitrile films, styrene copolymer films, polyamide films, cellulose derivative films and the like. These films may be used in stretched form if necessary. The haze is preferably no greater than 5. A smaller film thickness is advantageous for image formability and economy, but the range of 10-30 µm is preferred due to maintaining strength.

It is an important property for the protective layer used in the photosensitive resin laminate, for the adhesive force on the photosensitive resin layer to be sufficiently lower with respect to the protective layer than with respect to the support, to allow easier release. For example, a polyethylene film, polypropylene film or the like is preferably used as the protective layer. The film with excellent releasability disclosed in Japanese Unexamined Patent Publication SHO No. 59-202457 may also be used.

The protective layer film thickness is preferably 10-100 µm and more preferably 10-50 µm.

The thickness of the photosensitive resin layer in the photosensitive resin laminate of the invention will differ depending on the purpose of use, but it is in the range of preferably 5-100 µm and more preferably 7-60 µm with a smaller thickness improving the resolution and a larger thickness improving the film strength.

The method for successive lamination of the support, photosensitive resin layer and if necessary the protective layer to produce the photosensitive resin laminate of the invention may be a method that is known in the prior art.

For example, the photosensitive resin composition to be used in the photosensitive resin layer may be combined with a solvent that dissolves it to obtain a homogeneous solution, and first coated onto the support with a bar coater or roll coater and dried, to laminate the photosensitive resin layer composed of the photosensitive resin composition on the support.

Next, if necessary, the protective layer may be laminated on the photosensitive resin layer to produce a photosensitive resin laminate.

<Method for Forming Resist Pattern>

The invention further provides a method for forming a resist pattern which comprises a lamination step in which a photosensitive resin laminate of the invention as described above is laminated on a substrate, an exposure step in which the photosensitive resin layer of the photosensitive resin laminate is exposed to active light, and a developing step in which the unexposed sections of the photosensitive resin layer are removed by dispersion. As a specific example of the method for forming a resist pattern, first in the lamination step, a laminator is used, for example, to coat the photosensitive resin composition onto the support, thus laminating the photosensitive resin layer on the support, and if necessary a protective layer is laminated on the photosensitive resin layer. When the photosensitive resin laminate has a protective layer, the protective layer is released and then the photosensitive resin layer is laminated on the substrate surface by thermocompression bonding with a laminator, for example. In this case, the photosensitive resin layer may be laminated on only one side or on both sides of the substrate surface. The heating temperature for thermocompression bonding will generally be 40-160° C. Carrying out thermocompression bonding two or more times can improve the adhesiveness and chemical resistance. The contact bonding may be accomplished using a two-stage laminator provided with a double roll, or contact bonding may be accomplished by repeatedly passing the laminated body through a roll.

Next, in the exposure step, an exposure device is used for active light exposure of the photosensitive resin layer. If necessary, the support may be released before exposure and the photosensitive resin layer exposed to active light through a photomask. The exposure dose is determined by the light source illuminance and exposure time. The exposure dose may be measured using an illuminometer.

A maskless exposure method may also be used for the exposure step. Maskless exposure is a method in which direct imaging exposure is carried out on the substrate without using a photomask. The light source used may be a semiconductor laser or ultra-high-pressure mercury lamp with a wavelength of 350-410 nm. The drawing pattern is controlled by a computer, in which case the exposure dose is determined by the light source illuminance and the travelling speed of the substrate.

Next, in the developing step, a developing apparatus is used to remove the unexposed sections of the photosensitive resin layer by dispersion. After exposure, the support on the photosensitive resin layer is removed if necessary, if it is present, and then the developing solution which is an aqueous alkali solution is used to develop and remove the unexposed sections, to obtain a resist image. An aqueous solution of $Na_2CO_3$, $K_2CO_3$ or the like may be used as the aqueous alkali solution. These may be selected according to the properties of the photosensitive resin layer, but it will generally be a 20-40° C. $Na_2CO_3$ aqueous solution with a concentration of 0.2-2 wt %. The aqueous alkali solution may also contain added surfactants, antifoaming agents, and a small amount of an organic solvent to accelerate development.

The resist pattern can be obtained by the process described above, but in some cases it may be followed by a post-heating step at 100-300° C. A post-heating step can further improve the chemical resistance. A heating furnace based on a hot air, infrared ray or far-infrared ray system may be used for the heating.

<Process for Producing Printed Circuit Board>

The present invention further provides a process for producing a printed circuit board characterized by including a step of etching or plating the board on which a resist pattern has been formed by the method for forming a resist pattern of the invention described above. The process for producing a printed circuit board according to the invention can be carried out by the following step, after the method for forming a resist pattern, using a copper clad laminate, flexible board or the like as the board.

First, a conductor pattern is formed on the surface of a substrate (for example, a copper surface) that has been exposed by development according to the method for forming a resist pattern, using a known method such as etching or plating. Next, the resist pattern is released from the substrate using an aqueous solution of stronger alkalinity than the developing solution, to obtain the desired printed circuit board. The aqueous alkali solution used for release (hereunder referred to as "release solution") is not particularly restricted, but will generally be a 40-70° C. aqueous solution of NaOH, KOH or the like with a concentration of 2-5 wt %. A small amount of a water-soluble solvent may also be added to the release solution.

<Process for Producing Lead Frame>

The present invention further provides a process for producing a lead frame characterized by including a step of etching the substrate on which a resist pattern has been formed by the method for forming a resist pattern of the invention described above. The process for producing a lead frame according to the invention can be carried out by the following step, after the method for forming a resist pattern, using a metal sheet of copper, copper alloy, iron-based alloy or the like as the substrate.

First, a conductor pattern is formed by etching on a substrate that has been exposed by development using a method for forming a resist pattern. The resist pattern may then be released from the substrate by the same method as the process for producing a printed circuit board described above, to obtain the desired lead frame.

<Process for Producing Semiconductor Package>

The present invention further provides a process for producing a semiconductor package which includes a step of etching or plating the board on which a resist pattern has been formed by the method for forming a resist pattern of the invention described above. The process for producing a semiconductor package according to the invention can be carried out by the following step, after the method for forming a resist pattern described above, using a complete circuit-formed wafer as an LSI, for example, as the substrate.

First, a conductor pattern is formed by cylinder plating with copper, solder or the like on the opening of a substrate that has been exposed by development by a method for forming a resist pattern. Next, the resist pattern is released from the substrate by the same method as the process for producing a printed circuit board described above, and the thin metal layer on the sections other than the cylinder plated sections are removed by etching to obtain the desired semiconductor package.

<Process for Producing Concavoconvex Board>

The present invention further provides a process for producing a concavoconvex board which includes a step of sand blasting the substrate on which a resist pattern has been formed by the method for forming a resist pattern of the invention described above. When a photosensitive resin laminate of the invention is used as a dry film resist in a sand blasting method for working of a substrate, formation of the photosensitive resin laminate is accomplished by forming the photosensitive resin laminate on the substrate by the method described above and subjecting it to exposure and development to form a resist pattern. Alternatively, a concavoconvex board having a desired irregularity pattern formed on the substrate may be obtained through a sand blast treatment step in which an abrasive material is blasted from above the formed resist pattern for shaving to a target height, and a releasing step in which the remaining resin sections on the substrate are removed from the substrate with an alkaline release solution or the like. A known abrasive material may be used for the sand blast treatment step, and for example, fine particles of SiC, $SiO_2$, $Al_2O_3$, $CaCO_3$, $ZrO_2$, glass, stainless steel or the like with a particle size of about 2-100 μm may be used. The concavoconvex board may be suitably used as a back plate in a flat-panel display, for example.

EXAMPLES

The present invention will now be explained in greater detail with reference to examples, with the understanding that the invention is not meant to be limited to these examples.

First, a method of fabricating evaluation samples for the examples and comparative examples will be explained, followed by the evaluation method and evaluation results for each of the obtained samples.

Examples 1A-9A, Comparative Examples 1A-6A,
Examples 1B-8B, Comparative Examples 1B-6B,
Examples 1C-9C, Comparative Examples 1C-6C 1. Fabrication of Evaluation Samples Photosensitive resin laminates for each of the examples and comparative examples were fabricated in the following manner.

<Fabrication of Photosensitive Resin Laminate>

To each of the photosensitive resin compositions listed in Tables 1, 3 and 5 (where the parts by weight for P-1A-P-5A, P-1B-P-3B and P-1C-P-3C are the values including methyl ethyl ketone) there was added a solvent to a solid content of 50 wt %, and after thorough stirring and mixing, a bar coater was used for even coating onto the surface of a 19 μm-thick polyethylene terephthalate film as the support, and the coated composition was dried in a drier at 95° C. for 4 minutes to form a photosensitive resin layer. The thicknesses of the photosensitive resin layers were 40 μm (compositions listed in Tables 1 and 5) and 25 μm (compositions listed in Table 3).

Next, a 23 μm-thick polyethylene film was attached as a protective layer to the surface of the photosensitive resin layer without the laminated polyethylene terephthalate film, to obtain a photosensitive resin laminate.

The names of the material components in the photosensitive resin compositions represented by symbols in Tables 1, 3 and 5 are shown in Tables 2, 4 and 6.

Comparative Examples 1A-5A are compositions that do not contain the (d) pyrazoline compound (A-7A and A-8A) used for the invention. Comparative Example 6A is a composition that does not contain the triarylimidazolyl dimer (A-2A) used for the invention. Comparative Examples 1B-5B are compositions that do not contain the (d) pyrazoline compound (A-7B and A-8B) used for the invention. Comparative Example 6B is a composition that does not contain the triarylimidazolyl dimer (A-2B) used for the invention. Comparative Examples 1C-5C are compositions that do not contain the (d) pyrazoline compound (A-7C and A-8C) used for the invention. Comparative Example 6C is a composition that does not contain the triarylimidazolyl dimer (A-2C) used for the invention.

<Substrate Surface Conditioning>

Substrates for evaluation of sensitivity and resolution were prepared by jet scrub polishing (SAKURANDOM R™ #220 by Japan Carlit Co., Ltd.) with a spray pressure of 0.20 MPa.

<Laminate>

The polyethylene film of the photosensitive resin laminate was released while using a hot roll laminator for application onto a surface conditioned copper clad laminate preheated to 60° C. (AL-70 by Asahi Kasei Engineering Corporation), for lamination at a roll temperature of 105° C. The air pressure was 0.35 MPa and the laminating speed was 1.5 m/min.

<Light Exposure>

An i-line radiation type direct imaging exposure device (Paragon-9000 DI exposure device by Orbotech, Ltd., light source: UV semiconductor excimer solid state laser by Coherent Japan, Inc., main wavelength: 355±3 nm) and an h-line radiation type direct imaging exposure device (DI-2080 DI exposure device by Orc Manufacturing Co., Ltd., light source: GaN violet diode, main wavelength: 407±3 nm)

were used for sensitivity evaluation, with exposure at an exposure dose for 8 steps of a step tablet.

<Development>

After releasing the polyethylene terephthalate film, a 1 wt % $Na_2CO_3$ aqueous solution at 30° C. was sprayed for a prescribed period of time and the unexposed sections of the photosensitive resin layer were removed by dissolution. The shortest time required to completely dissolve the unexposed sections of the photosensitive resin layer was recorded as the minimum developing time.

2. Evaluation Method (1) Compatibility test

Each of the photosensitive resin compositions listed in Tables 1, 3 and 5 was thoroughly stirred and mixed, a bar coater was used for even coating onto the surface of a 19 μm-thick polyethylene terephthalate film as the support, and the coated composition was dried in a drier at 95° C. for 4 minutes to form a photosensitive resin layer. Next, the coated surface was visually observed and ranked in the following manner.
A: Even coated surface.
B: Deposition of undissolved matter on coated surface.

(2) Sensitivity Evaluation

Substrates for sensitivity and resolution evaluation that had been allowed to stand for 15 minutes after lamination were exposed using a Stouffer 21-step tablet with varying luminance in 21 steps from transparent to black. After exposure, development was performed for a developing time of twice the minimum developing time, and ranking was assigned in the following manner based on the exposure dose at which the resist film completely remained on 8 steps of the step tablet.
A: Exposure dose of no greater than 20 $mJ/cm^2$.
B: Exposure dose of greater than 20 $mJ/cm^2$ and no greater than 30 $mJ/cm^2$.
C: Exposure dose of greater than 30 $mJ/cm^2$ and no greater than 50 $mJ/cm^2$.
D: Exposure dose of greater than 50 $mJ/cm^2$.

(3) Resolution Evaluation

Substrates for sensitivity and resolution evaluation that had been allowed to stand for 15 minutes after lamination were exposed through a line pattern mask with an exposed section/unexposed section width ratio of 1:1. Development was performed for a developing time of twice the minimum developing time, and the resolution was recorded as the value of the minimum mask line width at which a hardened resist line was properly formed.
Evaluation criteria for Tables 1 and 5.
A: Resolution value of no greater than 30 μm.
B: Resolution value of greater than 30 μm and no greater than 35 μm.
C: Resolution value of greater than 35 μm and no greater than 40 μm.
D: Resolution value of greater than 45 μm.
Evaluation criteria for Table 3.
A: Resolution value of no greater than 15 μm.
B: Resolution value of greater than 15 μm and no greater than 20 μm.
C: Resolution value of greater than 20 μm and no greater than 25 μm.
D: Resolution value of greater than 25 μm.

(4) Adhesiveness Evaluation

Substrates for sensitivity and resolution evaluation that had been allowed to stand for 15 minutes after lamination were exposed through a line pattern mask with an exposed section/unexposed section width ratio of 1:100. Development was performed for a developing time of twice the minimum developing time, and the adhesiveness was recorded as the value of the minimum mask width at which a hardened resist line was properly formed.
Evaluation criteria for Tables 1 and 5.
A: Adhesiveness value of no greater than 30 μm.
B: Adhesiveness value of greater than 30 μm and no greater than 35 μm.
C: Adhesiveness value of greater than 35 μm and no greater than 40 μm.
D: Adhesiveness value of greater than 45 μm.
Evaluation criteria for Table 3.
A: Adhesiveness value of no greater than 15 μm.
B: Adhesiveness value of greater than 15 μm and no greater than 20 μm.
C: Adhesiveness value of greater than 20 μm and no greater than 25 μm.
D: Adhesiveness value of greater than 25 μm.

(5) Light source selectivity

Light source selectivity was defined as the ability to use the same exposure dose when using an i-line radiation-type exposure device (Paragon-9000 DI exposure device by Orbotech, Ltd.) and an h-line radiation type exposure device (DI-2080 DI exposure device by Orc Manufacturing Co., Ltd.), and it was ranked in the following manner.
A: Difference of less than 5 $mJ/cm^2$ for exposure dose for 8 steps of step tablet.
B: Difference of at least 5 $mJ/cm^2$ for exposure dose for 8 steps of step tablet.

(6) Evaluation of Aggregation in Developing Solution.

The photosensitive resin layer in a photosensitive resin laminate with a thickness of 40 μm and an area of 0.15 $m^2$, fabricated by the method described above, was dissolved in 200 ml of 1 wt % aqueous $Na_2CO_3$, and a circulating sprayer was used for spraying at a spray pressure of 0.1 MPa for 3 hours. The spray tank interior of the sprayer was then visually observed and ranked in the following manner.
A: No aggregates.
B: Small amount of powdery or oily matter observed on bottom section or sides of spray tank.
C: Large amount of powdery or oily matter observed on bottom section or sides of spray tank.

3. Evaluation Results

The evaluation results for the examples and comparative examples are shown in Table 1.

According to the results in Tables 1, 3 and 5:

1) Examples 1A-8A which satisfied the conditions of the invention were excellent in all of the evaluations of compatibility, light source selectivity, aggregation in the developing solution, sensitivity for i-line radiation exposure and h-line radiation exposure, resolution and adhesiveness, while Examples 1B-8B and Examples 1C-9C were excellent in all of the evaluations of compatibility, light source selectivity, sensitivity for i-line radiation exposure and h-line radiation exposure, resolution and adhesiveness, 2) Of Comparative Examples 1A-5A, Comparative Examples 1B-5B and Comparative Examples 1C-5C, which did not include the pyrazoline compound (d) (A-7A-A-8A, A-7B-A-8B, A-7C-A-8C) of formula (III), the light source selectivity was inferior in all of Comparative Examples 1A and 3A-5A, Comparative Examples 1B and 3B-5B, Comparative Examples 1C and 3C-5C, the sensitivity for i-line radiation exposure and h-line radiation exposure and the resolution and adhesiveness were inferior in at least one, while Comparative Example 2A, Comparative Example 2B and Comparative Example 2C had extremely poor compatibility of the pyrazoline compound (A-3A, A-3B, A-3C) and had deposition of undissolved matter on the resist surface (making further evaluation impossible), and 3) Comparative Example 6A, Comparative Example 6B and Comparative Example 6C, which did not include the triarylimidazolyl dimer (c) (A-2A, A-2B, A-2C), had insufficient photocuring of the resist and no formation of a resist line (making further evaluation impossible).

TABLE 1

| | | Example 1 | Example 2 | Example 3 | Example 4 | Example 5 | Example 6 | Example 7 | Example 8 |
|---|---|---|---|---|---|---|---|---|---|
| Photosensitive resin composition (parts by wt.) | P-1A | 73 | 73 | 73 | 73 | | | 73 | 73 |
| | P-2A | | | | | 64 | | | |
| | P-3A | | | | | | 60 | | |
| | P-4A | 78 | 78 | 78 | 78 | 78 | 78 | 78 | 78 |
| | P-5A | | | | | | | | |
| | M-1A | 15 | 15 | 15 | 15 | 15 | 15 | 15 | 15 |
| | M-2A | 10 | 10 | 10 | 10 | 10 | 10 | 10 | 10 |
| | M-3A | 5 | 5 | 5 | 5 | 5 | 5 | 5 | 5 |
| | M-4A | 10 | 10 | 10 | 10 | 10 | 10 | 10 | 10 |
| | M-5A | 5 | 5 | 5 | 5 | 5 | 5 | 5 | 5 |
| | A-1A | | | | | | | | |
| | A-2A | 4 | 4 | 4 | 4 | 4 | 4 | 4 | 4 |
| | A-3A | | | | | | | | |
| | A-4A | | | | | | | | |
| | A-5A | | | | | | | | |
| | A-6A | | | | | | | | |
| | A-7A | 0.3 | | | | | | | |
| | A-8A | | 0.3 | 0.1 | 0.8 | 0.3 | 0.3 | 0.3 | 0.3 |
| | A-9A | 0.1 | 0.1 | 0.1 | 0.1 | 0.1 | 0.1 | 0.1 | 0.1 |
| | B-1A | 0.04 | 0.04 | 0.04 | 0.04 | 0.04 | 0.04 | 0.04 | 0.04 |
| | B-2A | 0.5 | 0.5 | 0.5 | 0.5 | 0.5 | 0.5 | 0.5 | 0.5 |
| | C-1A | | | | | | | 3 | |
| | C-2A | | | | | | | | 3 |
| Compatibility | (rank) | A | A | A | A | A | A | A | A |
| Sensitivity for I-line radiation exposure unit | (mJ/cm$^2$/rank) | 20/A | 20/A | 30/B | 15/A | 20/A | 20/A | 20/A | 20/A |
| Resolution for I-line radiation exposure unit | (μm/rank) | 35/B | 35/B | 35/B | 35/B | 30/A | 35/B | 35/B | 35/B |
| Adhesion for I-line radiation exposure unit | (μm/rank) | 35/B | 35/B | 35/B | 35/B | 35/B | 35/B | 35/B | 35/B |
| Sensitivity for H-line radiation exposure unit | (mJ/cm$^2$/rank) | 20/A | 20/A | 25/B | 15/A | 20/A | 20/A | 20/A | 20/A |
| Resolution for H-line radiation exposure unit | (μm/rank) | 35/B | 35/B | 35/B | 35/B | 30/A | 35/B | 35/B | 35/B |
| Adhesion for H-line radiation exposure unit | (μm/rank) | 35/B | 35/B | 35/B | 35/B | 35/B | 35/B | 35/B | 35/B |
| Light source selectivity | (rank) | A | A | A | A | A | A | A | A |
| Aggregation in developing solution | (rank) | B | B | B | B | B | A | A | A |

| | | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| | Photosensitive resin composition (parts by wt.) | P-1A | 73 | 73 | 73 | 73 | 73 | 73 |
| | | P-2A | | | | | | |
| | | P-3A | | | | | | |
| | | P-4A | 78 | 78 | 78 | 78 | 78 | 78 |
| | | P-5A | | | | | | |
| | | M-1A | 15 | 15 | 15 | 15 | 15 | 15 |
| | | M-2A | 10 | 10 | 10 | 10 | 10 | 10 |
| | | M-3A | 5 | 5 | 5 | 5 | 5 | 5 |
| | | M-4A | 10 | 10 | 10 | 10 | 10 | 10 |
| | | M-5A | 5 | 5 | 5 | 5 | 5 | 5 |
| | | A-1A | 0.3 | | | | | |
| | | A-2A | 4 | 4 | 4 | 4 | 4 | |
| | | A-3A | | 0.3 | | | | |
| | | A-4A | | | 0.3 | | | |
| | | A-5A | | | | 0.3 | | |
| | | A-6A | | | | | 0.3 | |
| | | A-7A | | | | | | 0.3 |
| | | A-8A | | | | | | |
| | | A-9A | 0.1 | 0.1 | 0.1 | 0.1 | 0.1 | 0.1 |
| | | B-1A | 0.04 | 0.04 | 0.04 | 0.04 | 0.04 | 0.04 |
| | | B-2A | 0.5 | 0.5 | 0.5 | 0.5 | 0.5 | 0.5 |
| | | C-1A | | | | | | |
| | | C-2A | | | | | | |
| | Compatibility | (rank) | A | B | A | A | A | A |
| | Sensitivity for I-line radiation exposure unit | (mJ/cm$^2$/rank) | 25/B | *1 | 30/B | 30/B | 20/A | *2 |

TABLE 1-continued

|  |  |  |  |  |  |  |  |
|---|---|---|---|---|---|---|---|
| Resolution for I-line radiation exposure unit | (μm/rank) | 35/B | *1 | 40/C | 40/C | 35/B | *2 |
| Adhesion for I-line radiation exposure unit | (μm/rank) | 40/C | *1 | 40/C | 40/C | 35/B | *2 |
| Sensitivity for H-line radiation exposure unit | (mJ/cm$^2$/rank) | 80/D | *1 | 20/A | 20/A | 30/B | *2 |
| Resolution for H-line radiation exposure unit | (μm/rank) | 100/D | *1 | 35/B | 35/B | 40/C | *2 |
| Adhesion for H-line radiation exposure unit | (μm/rank) | 100/D | *1 | 35/B | 35/B | 45/D | *2 |
| Light source selectivity | (rank) | B | *1 | B | B | B | *2 |
| Aggregation in developing solution | (rank) | B | *1 | B | B | B | *2 |

*1 Could not evaluate due to undissolved matter on resist surface.
*2 Insufficient photocuring of resist, no resist line formation.

TABLE 2

| Symbol | Component |
|---|---|
| P-1A | 37 wt % Methyl ethyl ketone solution, by solid weight, of copolymer with composition: methacrylic acid/styrene/benzyl methacrylate (weight ratio: 30/20/50), acid equivalents: 287, weight-average molecular weight: 55,000 |
| P-2A | 42 wt % Methyl ethyl ketone solution, by solid weight, of copolymer with composition: methacrylic acid/benzyl methacrylate (weight ratio: 20/80), acid equivalents: 430, weight-average molecular weight: 50,000 |
| P-3A | 45 wt % Methyl ethyl ketone solution, by solid weight, of copolymer with composition: methacrylic acid/2-ethylhexyl acrylate/benzyl methacrylate (weight ratio: 25/10/65), acid equivalents: 344, weight-average molecular weight: 50,000 |
| P-4A | 30 Solid wt % methyl ethyl ketone solution of copolymer with composition: methyl methacrylate/methacrylic acid/n-butyl acrylate (weight ratio: 65/25/10), acid equivalents: 344, weight-average molecular weight: 120,000 |
| P-5A | 40 Solid wt % methyl ethyl ketone solution of copolymer with composition: methyl methacrylate/methacrylic acid/2-ethylhexyl acrylate (weight ratio: 65/25/10), acid equivalents: 344, weight-average molecular weight: 85,000 |
| M-1A | Urethaned product of hexamethylene diisocyanate and pentapropyleneglycol monomethacrylate |
| M-2A | α,ω-Dimethacrylate of triethyleneglycoldodecapropyleneglycoltriethylene glycol |
| M-3A | 4-Nonylphenylheptaethyleneglycol dipropyleneglycol acrylate (NOF Corporation, LS-100A) |
| M-4A | Tetraethyleneglycol dimethacrylate (Shin-Nakamura Chemical Co., Ltd., NK Ester 4G) |
| M-5A | Triacrylate comprising average of 3 mol ethylene oxide added to trimethylolpropane (A-TMPT-3E0, trade name of Shin-Nakamura Chemical Co., Ltd.) |
| A-1A | 4,4'-bis(Diethylamino)benzophenone |
| A-2A | 2-(o-Chlorophenyl)-4,5-diphenylimidazolyl dimer |
| A-3A | 1,5-Diphenyl-3-styryl-pyrazoline (Nippon Chemical Industrial Co., Ltd.) |
| A-4A | 1-Phenyl-3-(4-tert-butyl-styryl)-5-(4-tert-butyl-phenyl)-pyrazoline (Nippon Chemical Industrial Co., Ltd.) |
| A-5A | 1-(4-(Benzooxazole-2-yl)phenyl)-3-(4-tert-butylstyryl)-5-(4-tert-butylphenyl)-pyrazoline (Nippon Chemical Industrial Co., Ltd.) |
| A-6A | 1-Phenyl-3-(4-biphenyl)-5-(4-isopropyl-phenyl)-pyrazoline (Nippon Chemical Industrial Co., Ltd.) |
| A-7A | 1-Phenyl-3-(4-biphenyl)-5-(4-tert-butyl-phenyl)-pyrazoline (Nippon Chemical Industrial Co., Ltd.) |
| A-8A | 1-Phenyl-3-(4-biphenyl)-5-(4-tert-octyl-phenyl)-pyrazoline (Nippon Chemical Industrial Co., Ltd.) |
| A-9A | N-Phenylglycine |
| B-1A | Victoria pure blue |
| B-2A | Leuco crystal violet |
| C-1A | Compound of formula (IV), $R_6 = R_7 = R_9$: oleyl, $R_8$: hydrogen, $k + l + m + n = 20$, A: —CH$_2$CH$_2$—(NEWCOL ™ 3-85 by Nippon Nyukazai Co., Ltd.) |
| C-2A | Compound of formula (V), $R_6$: coconut oil fatty acid acyl, $R_7 = R_8 = R_9$: hydrogen, $k + l + m + n = 0$ (IONET ™ S-20, Saanyo Chemical Industries, Ltd.) |

TABLE 3

|  |  | Example 1 | Example 2 | Example 3 | Example 4 | Example 5 | Example 6 | Example 7 | Example 8 |
|---|---|---|---|---|---|---|---|---|---|
| Photosensitive resin composition (parts by wt.) | P-1B | 33 | 33 | 33 | 33 | 33 | 33 | 33 | 33 |
|  | P-2B | 107 | 107 | 107 | 107 | 107 | 107 | 107 |  |
|  | P-3B |  |  |  |  |  |  |  | 102 |
|  | M-1B | 15 | 15 | 15 | 15 |  | 15 | 15 | 15 |
|  | M-2B |  |  |  |  | 15 |  |  |  |
|  | M-3B | 15 | 15 | 15 | 15 | 15 | 15 | 15 | 15 |
|  | M-4B | 5 | 5 | 5 | 5 | 5 | 5 | 5 | 5 |
|  | M-5B |  |  |  |  |  | 10 |  |  |
|  | M-6B |  |  |  |  |  |  | 10 |  |
|  | M-7B | 10 | 10 | 10 | 10 | 10 |  |  | 10 |
|  | A-1B |  |  |  |  |  |  |  |  |
|  | A-2B | 4 | 4 | 4 | 4 | 4 | 4 | 4 | 4 |
|  | A-3B |  |  |  |  |  |  |  |  |
|  | A-4B |  |  |  |  |  |  |  |  |

TABLE 3-continued

| | | | | | | | | | |
|---|---|---|---|---|---|---|---|---|---|
| | A-5B | | | | | | | | |
| | A-6B | | | | | | | | |
| | A-7B | 0.3 | | | | | | | |
| | A-8B | | 0.3 | 0.1 | 1 | 0.3 | 0.3 | 0.3 | 0.3 |
| | A-9B | 0.1 | 0.1 | 0.1 | 0.1 | 0.1 | 0.1 | 0.1 | 0.1 |
| | B-1B | 0.04 | 0.04 | 0.04 | 0.04 | 0.04 | 0.04 | 0.04 | 0.04 |
| | B-2B | 0.5 | 0.5 | 0.5 | 0.5 | 0.5 | 0.5 | 0.5 | 0.5 |
| Compatibility | (rank) | A | A | A | A | A | A | A | A |
| Sensitivity for I-line radiation exposure unit | (mJ/cm$^2$/rank) | 20/A | 20/A | 30/B | 15/A | 20/A | 20/A | 20/A | 20/A |
| Resolution for I-line radiation exposure unit | (μm/rank) | 20/B | 20/B | 20/B | 20/B | 20/B | 15/A | 15/A | 20/B |
| Adhesion for I-line radiation exposure unit | (μm/rank) | 15/A | 15/A | 20/B | 20/B | 15/A | 15/A | 15/A | 20/B |
| Sensitivity for H-line radiation exposure unit | (mJ/cm$^2$/rank) | 20/A | 20/A | 25/B | 15/A | 20/A | 20/A | 20/A | 20/A |
| Resolution for H-line radiation exposure unit | (μm/rank) | 20/B | 20/B | 20/B | 20/B | 20/B | 15/A | 15/A | 20/B |
| Adhesion for H-line radiation exposure unit | (μm/rank) | 15/A | 15/A | 20/B | 20/B | 15/A | 15/A | 15/A | 30/B |
| Light source selectivity | (rank) | A | A | A | A | A | A | A | A |

| | | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| Photosensitive resin composition (parts by wt.) | | P-1B | 33 | 33 | 33 | 33 | 33 | 33 |
| | | P-2B | 107 | 107 | 107 | 107 | 107 | 107 |
| | | P-3B | | | | | | |
| | | M-1B | 15 | 15 | 15 | 15 | 15 | 15 |
| | | M-2B | | | | | | |
| | | M-3B | 15 | 15 | 15 | 15 | 15 | 15 |
| | | M-4B | 5 | 5 | 5 | 5 | 5 | 5 |
| | | M-5B | | | | | | |
| | | M-6B | | | | | | |
| | | M-7B | 10 | 10 | 10 | 10 | 10 | 10 |
| | | A-1B | 0.3 | | | | | |
| | | A-2B | 4 | 4 | 4 | 4 | 4 | |
| | | A-3B | | 0.3 | | | | |
| | | A-4B | | | 0.3 | | | |
| | | A-5B | | | | 0.3 | | |
| | | A-6B | | | | | 0.3 | |
| | | A-7B | | | | | | 0.3 |
| | | A-8B | | | | | | |
| | | A-9B | 0.1 | 0.1 | 0.1 | 0.1 | 0.1 | 0.1 |
| | | B-1B | 0.04 | 0.04 | 0.04 | 0.04 | 0.04 | 0.04 |
| | | B-2B | 0.5 | 0.5 | 0.5 | 0.5 | 0.5 | 0.5 |
| Compatibility | (rank) | | A | B | A | A | A | A |
| Sensitivity for I-line radiation exposure unit | (mJ/cm$^2$/rank) | | 25/B | *1 | 30/B | 30/B | 20/A | *2 |
| Resolution for I-line radiation exposure unit | (μm/rank) | | 20/B | *1 | 25/C | 25/C | 20/B | *2 |
| Adhesion for I-line radiation exposure unit | (μm/rank) | | 25/C | *1 | 25/C | 25/C | 20/B | *2 |
| Sensitivity for H-line radiation exposure unit | (mJ/cm$^2$/rank) | | 80/D | *1 | 20/A | 20/A | 30/B | *2 |
| Resolution for H-line radiation exposure unit | (μm/rank) | | 80/D | *1 | 20/B | 20/B | 25/C | *2 |
| Adhesion for H-line radiation exposure unit | (μm/rank) | | 80/D | *1 | 20/B | 20/B | 30/D | *2 |
| Light source selectivity | (rank) | | B | *1 | B | B | B | *2 |

*1 Could not evaluate due to undissolved matter on resist surface.
*2 Insufficient photocuring of resist, no resist line formation.

TABLE 4

| Symbol | Component |
|---|---|
| P-1B | 30 wt % Methyl ethyl ketone solution, by solid weight, of copolymer with composition: methyl methacrylate/methacrylic acid/n-butylyl acrylate (weight ratio: 65/25/10), acid equivalents: 344, weight-average molecular weight: 120,000 |
| P-2B | 43 wt % Methyl ethyl ketone solution, by solid weight, of copolymer with composition: methyl methacrylate/methacrylic acid/styrene (weight ratio: 50/25/25), acid equivalents: 340, weight-average molecular weight: 50,000 |
| P-3B | 45 wt % Methyl ethyl ketone solution, by solid weight, of copolymer with composition: methyl methacrylate/methacrylic acid/n-butylyl acrylate (weight ratio: 65/25/10), acid equivalents: 344, weight-average molecular weight: 50,000 |

TABLE 4-continued

| Symbol | Component |
|---|---|
| M-1B | Tricyclodecanedimethanol diacrylate (NK Ester A-DCP, trade name of Shin-Nakamura Chemical Co., Ltd.) |
| M-2B | Tricyclodecanedimethanol dimethacrylate (NK Ester DCP, trade name of Shin-Nakamura Chemical Co., Ltd.) |
| M-3B | Heptapropyleneglycol dimethacrylate (Toagosei Co., Ltd., TO-1559) |
| M-4B | 4-Nonylphenylheptaethyleneglycolpropyleneglycol acrylate (NOF Corp., LS-100A) |
| M-5B | Triacrylate comprising average of 3 mol ethylene oxide added to trimethylolpropane (A-TMPT-3EO, trade name of Shin-Nakamura Chemical Co., Ltd.) |
| M-6B | Tetraacrylate of glycol comprising average of 4 mol ethylene oxide added to pentaerythritol |
| M-7B | α,ω-Dimethacrylate of triethyleneglycoldodecapropyleneglycoltriethylene glycol |
| A-1B | 4,4'-bis(Diethylamino)benzophenone |
| A-2B | 2-(o-Chlorophenyl)-4,5-diphenylimidazolyl dimer |
| A-3B | 1,5-Diphenyl-3-styryl-pyrazolinene (Nippon Chemical Industrial Co., Ltd.) |
| A-4B | 1-Phenyl-3-(4-tert-butyl-styryl)-5-(4-tert-butyl-phenyl)-pyrazolinene (Nippon Chemical Industrial Co., Ltd.) |
| A-5B | 1-(4-(Benzooxazole-2-yl)phenyl)-3-(4-tert-butylstyryl)-5-(4-tert-butylphenyl)-pyrazolinene (Nippon Chemical Industrial Co., Ltd.) |
| A-6B | 1-Phenyl-3-(4-biphenyl)-5-(4-isopropyl-phenyl)-pyrazolinene (Nippon Chemical Industrial Co., Ltd.) |
| A-7B | 1-Phenyl-3-(4-biphenyl)-5-(4-tert-butyl-phenyl)-pyrazolinene (Nippon Chemical Industrial Co., Ltd.) |
| A-8B | 1-Phenyl-3-(4-biphenyl)-5-(4-tert-octyl-phenyl)-pyrazolinene (Nippon Chemical Industrial Co., Ltd.) |
| A-9B | N-Phenylglycine |
| B-1B | Malachite green |
| B-2B | Leuco crystal violet |

TABLE 5

| | | Example 1 | Example 2 | Example 3 | Example 4 | Example 5 | Example 6 | Example 7 | Example 8 |
|---|---|---|---|---|---|---|---|---|---|
| Photosensitive resin composition (parts by wt.) | P-1C | 33 | 33 | 33 | 33 | 33 | 33 | 33 | 33 |
| | P-2C | 107 | 107 | 107 | 107 | 107 | 107 | 107 | 107 |
| | P-3C | | | | | | | | |
| | M-1C | 30 | 30 | 30 | 30 | | | 15 | 30 |
| | M-2C | | | | | 30 | | | |
| | M-3C | | | | | | 30 | | |
| | M-4C | | | | | | | 15 | |
| | M-5C | | | | | | | | 30 |
| | M-6C | 15 | 15 | 15 | 15 | 15 | 15 | 15 | 15 |
| | A-1C | | | | | | | | |
| | A-2C | 4 | 4 | 4 | 4 | 4 | 4 | 4 | 4 |
| | A-3C | | | | | | | | |
| | A-4C | | | | | | | | |
| | A-5C | | | | | | | | |
| | A-6C | | | | | | | | |
| | A-7C | 0.3 | | | | | | | |
| | A-8C | | 0.3 | 0.1 | 0.8 | 0.3 | 0.3 | 0.3 | 0.3 |
| | A-9C | 0.1 | 0.1 | 0.1 | 0.1 | 0.1 | 0.1 | 0.1 | 0.1 |
| | B-1C | 0.04 | 0.04 | 0.04 | 0.04 | 0.04 | 0.04 | 0.04 | 0.04 |
| | B-2C | 0.5 | 0.5 | 0.5 | 0.5 | 0.5 | 0.5 | 0.5 | 0.5 |
| Compatibility | (rank) | A | A | A | A | A | A | A | A |
| Sensitivity for I-line radiation exposure unit | (mJ/cm$^2$/rank) | 20/A | 20/A | 30/B | 15/A | 20/A | 20/A | 20/A | 20/A |
| Resolution for I-line radiation exposure unit | (μm/rank) | 35/B | 35/B | 35/B | 35/B | 35/B | 35/B | 25/A | 35/B |
| Adhesion for I-line radiation exposure unit | (μm/rank) | 30/A | 30/A | 35/B | 35/A | 30/A | 30/A | 30/A | 30/A |
| Sensitivity for H-line radiation exposure unit | (mJ/cm$^2$/rank) | 20/A | 20/A | 25/B | 15/A | 20/A | 20/A | 20/A | 20/A |
| Resolution for H-line radiation exposure unit | (μm/rank) | 35/B | 35/B | 35/B | 35/B | 35/B | 35/B | 25/A | 35/B |
| Adhesion for H-line radiation exposure unit | (μm/rank) | 30/A | 30/A | 35/B | 35/B | 30/A | 30/A | 30/A | 30/A |
| Light source selectivity | (rank) | A | A | A | A | A | A | A | A |

| | | Example 9 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| Photosensitive resin composition (parts by wt.) | P-1C | 33 | 33 | | | | | |
| | P-2C | | 107 | 107 | 107 | 107 | 107 | 107 |
| | P-3C | 102 | | | | | | |
| | M-1C | 30 | 30 | 30 | 30 | 30 | 30 | 30 |
| | M-2C | | | | | | | |
| | M-3C | | | | | | | |
| | M-4C | | | | | | | |
| | M-5C | | | | | | | |
| | M-6C | 15 | 15 | 15 | 15 | 15 | 15 | 15 |
| | A-1C | | | 0.3 | | | | |
| | A-2C | 4 | 4 | | 4 | 4 | 4 | 4 |

TABLE 5-continued

| | | | | | | | | |
|---|---|---|---|---|---|---|---|---|
| A-3C | | | 0.3 | | | | | |
| A-4C | | | | 0.3 | | | | |
| A-5C | | | | | 0.3 | | | |
| A-6C | | | | | | 0.3 | | |
| A-7C | | | | | | | | 0.3 |
| A-8C | | 0.3 | | | | | | |
| A-9C | | 0.1 | 0.1 | 0.1 | 0.1 | 0.1 | 0.1 | 0.1 |
| B-1C | | 0.04 | 0.04 | 0.04 | 0.04 | 0.04 | 0.04 | 0.04 |
| B-2C | | 0.5 | 0.5 | 0.5 | 0.5 | 0.5 | 0.5 | 0.5 |
| Compatibility | (rank) | A | A | B | A | A | A | A |
| Sensitivity for I-line radiation exposure unit | (mJ/cm²/rank) | 20/A | 25/B | *1 | 30/B | 30/B | 20/A | *2 |
| Resolution for I-line radiation exposure unit | (μm/rank) | 35/B | 35/B | *1 | 40/C | 40/C | 35/B | *2 |
| Adhesion for I-line radiation exposure unit | (μm/rank) | 35/B | 40/C | *1 | 40/C | 40/C | 35/B | *2 |
| Sensitivity for H-line radiation exposure unit | (mJ/cm²/rank) | 20/A | 80/D | *1 | 20/A | 20/A | 30/B | *2 |
| Resolution for H-line radiation exposure unit | (μm/rank) | 35/B | 100/D | *1 | 35/B | 35/B | 40/C | *2 |
| Adhesion for H-line radiation exposure unit | (μm/rank) | 35/B | 100/D | *1 | 35/B | 35/B | 45/D | *2 |
| Light source selectivity | (rank) | A | B | *1 | B | B | B | *2 |

*1 Could not evaluate due to undissolved matter on resist surface.
*2 Insufficient photocuring of resist, no resist line formation.

TABLE 6

| Symbol | Component |
|---|---|
| P-1C | 30 wt % Methyl ethyl ketone solution, by solid weight, of copolymer with composition: methyl methacrylate/methacrylic acid/n-butylyl acrylate (weight ratio: 65/25/10), acid equivalents: 344, weight-average molecular weight: 120,000 |
| P-2C | 43 wt % Methyl ethyl ketone solution, by solid weight, of copolymer with composition: methyl methacrylate/methacrylic acid/styrenene (weight ratio: 50/25/25), acid equivalents: 340, weight-average molecular weight: 50,000 |
| P-3C | 45 wt % Methyl ethyl ketone solution, by solid weight, of copolymer with composition: methyl methacrylate/methacrylic acid/n-butylyl acrylate (weight ratio: 65/25/10), acid equivalents: 344, weight-average molecular weight: 50,000 |
| M-1C | (2,2-bis{4-(Methacryloxypentaethoxy)phenyl}propanene (BPE-500, trade name of Shin-Nakamura Chemical Co., Ltd.) |
| M-2C | Photopolymerizable monomer BP-412 (trade name of Toho Chemical Industry Co., Ltd.) of formula (III), $R_3 = R_4 = CH_3$, D: —CH(CH$_3$)CH$_2$—, E: —CH$_3$CH$_2$—, a3 + b3 = 4, a4 + b4 = 12 |
| M-3C | Photopolymerizable monomer of formula (III), $R_3 = R_4 = CH_3$, D: —CH(CH$_3$)CH$_2$—, E: —CH$_3$CH$_2$—, a3 + b3 = 4, a4 + b4 = 30 |
| M-4C | (2,2-bis{4-(Methacryloxydiethoxy)phenyl}propanene (BPE-200, trade name of Shin-Nakamura Chemical Co., Ltd.) |
| M-5C | (2,2-bis{4-(Methacryloxypentaethoxy)cyclohexyl}propane |
| M-6C | Heptapropyleneneglycol dimethacrylatete (NOF Corp., TO-1559) |
| A-1C | 4,4'-bis(Diethylamino)benzophenone |
| A-2C | 2-(o-Chlorohenyl)-4,5-diphenylimidazolyl dimer |
| A-3C | 1,5-Diphenyl-3-styryl-pyrazolinene (Nippon Chemical Industrial Co., Ltd.) |
| A-4C | 1-Phenyl-3-(4-tert-butyl-styryl)-5-(4-tert-butyl-phenyl)-pyrazolinene (Nippon Chemical Industrial Co., Ltd.) |
| A-5C | 1-(4-(Benzooxazole-2-yl)phenyl)-3-(4-tert-butylstyryl)-5-(4-tert-butylphenyl)-pyrazolinene (Nippon Chemical Industrial Co., Ltd.) |
| A-6C | 1-Phenyl-3-(4-biphenyl)-5-(4-isopropyl-phenyl)-pyrazolinene (Nippon Chemical Industrial Co., Ltd.) |
| A-7C | 1-Phenyl-3-(4-biphenyl)-5-(4-tert-butyl-phenyl)-pyrazolinene (Nippon Chemical Industrial Co., Ltd.) |
| A-8C | 1-Phenyl-3-(4-biphenyl)-5-(4-tert-octyl-phenyl)-pyrazolinene (Nippon Chemical Industrial Co., Ltd.) |
| A-9C | N-Phenylglycine |
| B-1C | Malachite green |
| B-2C | Leuco crystal violet |

INDUSTRIAL APPLICABILITY

The present invention can be utilized for precision working of metal foils in printed circuit board production, IC chip mounting lead frame production and metal mask production, as well as for production of packages such as BGA and CSP, production of tape substrates for COF or TAB, production of semiconductor bumps, production of partitions for flat panel displays, such as ITO electrodes, address electrodes and electromagnetic wave shields, and methods of working substrates by sand blasting. As methods of working by sand blasting there may be mentioned organic EL glass cap working, silicon wafer perforation working, and ceramic pin set working. The working in the sand blast step of the invention can be employed for production of electrodes with ferroelectric substance films, and metal material layers of precious metals, precious metal alloys, high melting point metals and high melting point metal compounds.

The invention claimed is:
1. A photosensitive resin composition comprising:
   (a) 20-90 wt % of a thermoplastic copolymer obtained by copolymerization of a copolymerizing component containing at least one compound selected from the group consisting of compounds represented by the following formula (I):

[Chemical Formula 1]

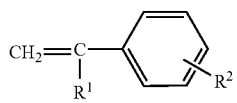
(I)

(wherein $R^1$ represents hydrogen atom or methyl group, and $R^2$ represents a group selected from the group consisting of hydrogen atom, halogen atoms, hydroxyl, C1-12 alkyl, C1-12 alkoxy, carboxyl and haloalkyl groups), and compounds represented by the following formula (II):

[Chemical Formula 2]

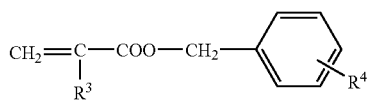
(II)

(wherein $R^3$ represents hydrogen atom or methyl group, and $R^4$ represents a group selected from the group consisting of hydrogen atom, halogen atoms, hydroxyl, C1-12 alkyl, C1-12 alkoxy, carboxyl and haloalkyl groups), and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 3]

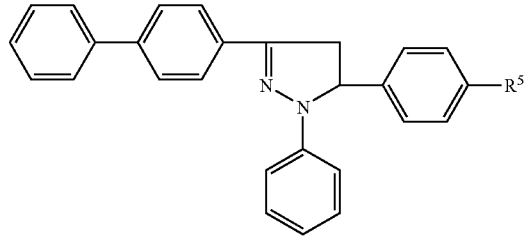
(III)

(wherein $R^5$ represents a C4-12 straight-chain or branched-chain alkyl group).

2. A photosensitive resin composition according to claim 1, which contains 2-ethylhexyl acrylate and/or 2-hydroxyethyl methacrylate as a copolymerizing component of the (a) thermoplastic copolymer.

3. A photosensitive resin composition according to claim 1, which further comprises at least one compound represented by the following formula (IV):

[Chemical Formula 4]

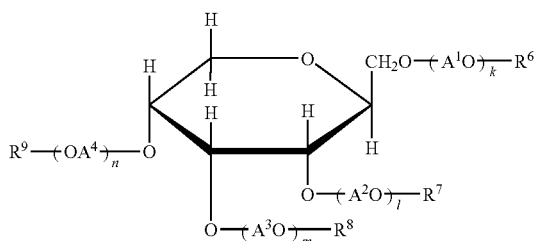
(IV)

(wherein $R^6$, $R^7$, $R^8$ and $R^9$ each independently represent hydrogen atom or a C1-30 fatty acid acyl group, $A^1$, $A^2$, $A^3$ and $A^4$ are each independently —CH(CH$_3$)CH$_2$—, —CH$_2$CH(CH$_3$)— or —CH$_2$CH$_2$—, wherein the repeating structures -($A^1$-O)-, -($A^2$-O)-, -($A^3$-O)- and -($A^4$-O)- may each be random or block, k, l, m and n are each independently an integer of 0 or greater, and k+l+m+n=0-40).

4. A photosensitive resin composition comprising:
(a) 20-90 wt % of a thermoplastic copolymer obtained by copolymerization of a copolymerizing component comprising an α,β-unsaturated carboxyl group-containing monomer, and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 5]

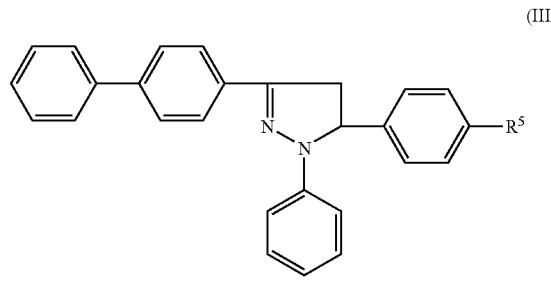
(III)

(wherein $R^5$ represents a C4-12 straight-chain or branched-chain alkyl group),
wherein the (b) addition polymerizable monomer having at least one terminal ethylenic unsaturated group contains at least one addition polymerizable monomer represented by the following formula (V):

[Chemical Formula 6]

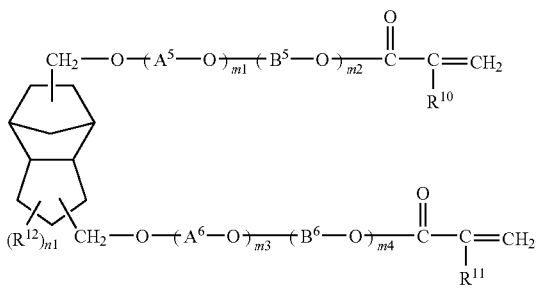
(V)

(wherein $R^{10}$ and $R^{11}$ each independently represent hydrogen atom or methyl group, $R^{12}$ represents a halogen atom or a C1-3 alkyl group, $A^5$, $A^6$, $B^5$ and $B^6$ each independently represent a C2-6 alkylene group, wherein the repeating structures -($A^5$-O)-, -($A^6$-O)-, -($B^5$-O)- and -($B^6$-O)- may each be random or block, m1, m2, m3 and m4 are each independently an integer of 0 or greater, m1+m2+m3+m4=0-40, and n1 is 0-14).

5. A photosensitive resin composition according to claim 4, wherein the (b) addition polymerizable monomer having at least one terminal ethylenic unsaturated group contains at least one selected from the group consisting of compounds represented by the following formula (VI):

[Chemical Formula 7]

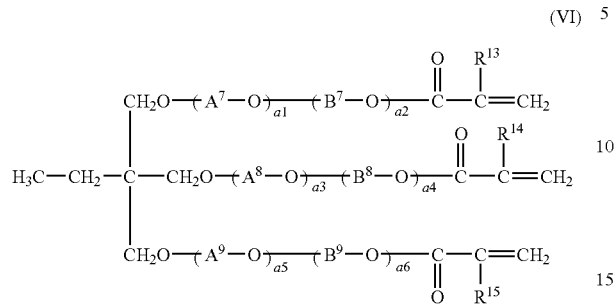

(VI)

(wherein $R^{13}$, $R^{14}$ and $R^{15}$ each independently represent hydrogen atom or methyl group, $A^7$, $A^8$, $A^9$, $B^7$, $B^8$ and $B^9$ each independently represent a C2-6 alkylene group, wherein the repeating structures -($A^7$-O)-, -($A^8$-O)-, -($A^9$-O)-, -($B^7$-O)-, -($B^8$-O)- and -($B^9$-O)- may each be random or block, a1, a2, a3, a4, a5 and a6 are each independently an integer of 0 or greater, and a1+a2+a3+a4+a5+a6=0-50), and compounds represented by the following formula (VII):

[Chemical Formula 8]

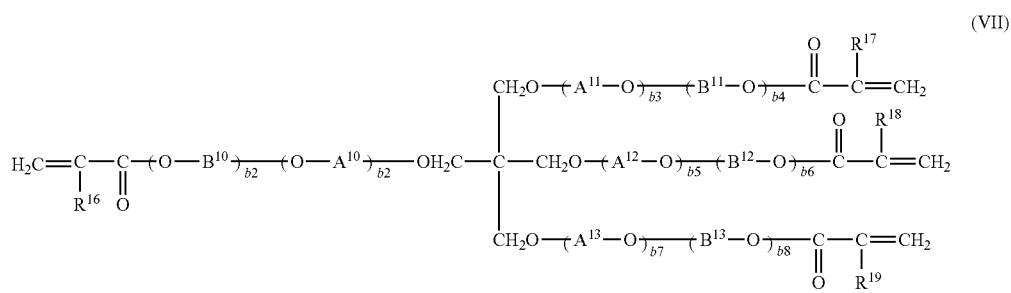

(VII)

(wherein $R^{16}$, $R^{17}$, $R^{18}$ and $R^{19}$ each independently represent hydrogen atom or methyl group, $A^{10}$, $A^{11}$, $A^{12}$, $A^{13}$, $B^{10}$, $B^{12}$ and $B^{13}$ each independently represent a C2-6 alkylene group, wherein the repeating structures -($A^{10}$-O)-, -($A^{11}$-O)-, -($A^{12}$-O)-, -($A^{13}$-O)-, -($B^{10}$-O)-, -($B^{11}$-O)-, -($B^{12}$-O)- and -($B^{13}$-O)- may each be random or block, b1, b2, b3, b4, b5, b6, b7 and b8 are each independently an integer of 0 or greater, and b1+b2+b3+b4+b5+b6+b7+b8=0-60).

6. A photosensitive resin composition comprising:
(a) 20-90 wt % of a thermoplastic copolymer obtained by copolymerization of a copolymerizing component comprising an α,β-unsaturated carboxyl group-containing monomer, and having a carboxyl group content of 100-600 acid equivalents and a weight-average molecular weight of 5,000-500,000,
(b) 5-75 wt % of an addition polymerizable monomer having at least one terminal ethylenic unsaturated group,
(c) 0.01-30 wt % of a photopolymerization initiator containing a triarylimidazolyl dimer, and
(d) 0.001-10 wt % of a pyrazoline compound represented by the following formula (III):

[Chemical Formula 9]

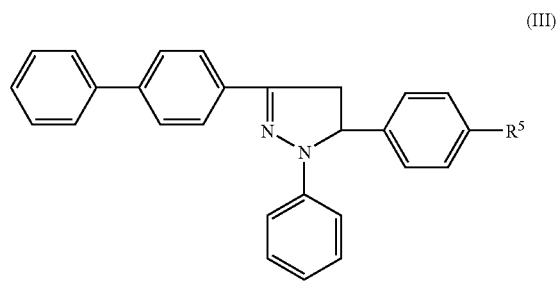

(III)

(wherein $R^5$ represents a C4-12 straight-chain or branched-chain alkyl group), wherein the (b) addition polymerizable monomer having at least one terminal ethylenic unsaturated group contains at least one selected from the group consisting of compounds represented by the following formula (VIII):

[Chemical Formula 10]

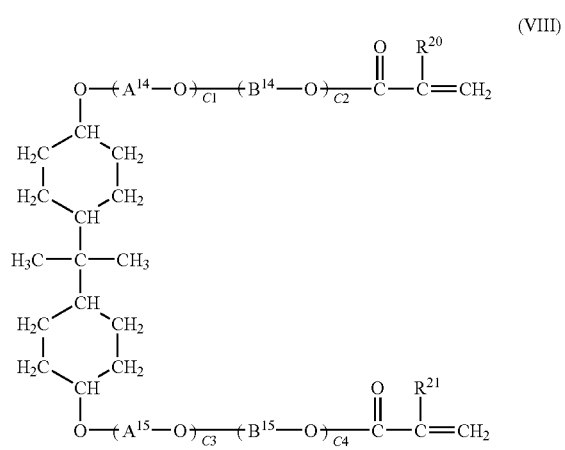

(VIII)

(wherein $R^{20}$ and $R^{21}$ each independently represent hydrogen atom or methyl group, $A^{14}$, $A^{15}$, $B^{14}$ and $B^{15}$ each independently represent a C2-6 alkylene group, wherein the repeating structures -($A^{14}$-O)-, -($A^{15}$-O)- ($B^{14}$-O)- and -($B^{15}$-O)- may each be random or block, c1, c2, c3 and c4 are each independently an integer of 0 or greater, and c1+c2+c3+c4=2-40), and compounds represented by the following formula (IX):

[Chemical Formula 11]

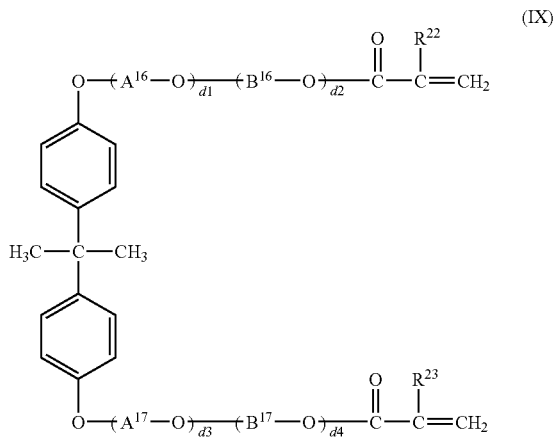

(wherein $R^{22}$ and $R^{23}$ each independently represent hydrogen atom or methyl group, $A^{16}$, $A^{17}$, $B^{16}$, $B^{17}$ each independently represent a C2-6 alkylene group, wherein the repeating structures -($A^{16}$-O)-, -($A^{17}$-O)-, -($B^{16}$-O)- and -($B^{17}$-O)- may each be random or block, d1, d2, d3 and d4 are each independently an integer of 0 or greater, and d1+d2+d3+d4=2-40).

7. A photosensitive resin composition according to claim 1, 4 or 6, wherein the (d) pyrazoline compound is at least one compound selected from the group consisting of 1-phenyl-3-(4-biphenyl)-5-(4-tert-butyl-phenyl)-pyrazoline and 1-phenyl-3-(4-biphenyl)-5-(4-tert-octyl-phenyl)-pyrazoline.

8. A photosensitive resin laminate comprising a support and a photosensitive resin layer laminated on the support, wherein the photosensitive resin layer is formed using a photosensitive resin composition according to claim 1, 4 or 6.

9. A method for forming a resist pattern which comprises:
   a lamination step in which a photosensitive resin laminate according to claim 8 is laminated on a substrate,
   an exposure step in which the photosensitive resin layer of the photosensitive resin laminate is exposed to active light, and
   a developing step in which the unexposed sections of the photosensitive resin layer are removed by dispersion.

10. A method for forming a resist pattern according to claim 9, wherein the exposure in the exposure step is accomplished by direct imaging.

11. A process for producing a printed circuit board, comprising a step of etching or plating a substrate having a resist pattern formed by the method for forming a resist pattern according to claim 9.

12. A process for producing a lead frame, comprising a step of etching a substrate having a resist pattern formed by the method for forming a resist pattern according to claim 9.

13. A process for producing a semiconductor package, comprising a step of etching or plating a substrate having a resist pattern formed by the method for forming a resist pattern according to claim 9.

14. A process for producing a concavoconvex board, comprising a step of sand blasting a substrate having a resist pattern formed by the method for forming a resist pattern according to claim 9.

* * * * *